(12) United States Patent
Gou et al.

(10) Patent No.: US 8,797,455 B2
(45) Date of Patent: Aug. 5, 2014

(54) ANALOG-TO-DIGITAL CONVERTER, IMAGE SENSOR INCLUDING THE SAME, AND APPARATUS INCLUDING IMAGE SENSOR

(75) Inventors: Ja Seung Gou, Seoul (KR); Oh Kyong Kwon, Seoul (KR); Min Seok Shin, Seoul (KR); Min Kyu Kim, Ulsan (KR)

(73) Assignee: SK Hynix Inc., Gyeonggi-do (KR)

( * ) Notice: Subject to any disclaimer, the term of this patent is extended or adjusted under 35 U.S.C. 154(b) by 78 days.

(21) Appl. No.: 13/549,737

(22) Filed: Jul. 16, 2012

(65) Prior Publication Data

US 2013/0033613 A1 Feb. 7, 2013

(30) Foreign Application Priority Data

Aug. 2, 2011 (KR) .................. 10-2011-0077012

(51) Int. Cl.
*H04N 5/225* (2006.01)
(52) U.S. Cl.
USPC .................. 348/374; 348/222.1; 348/294
(58) Field of Classification Search
USPC ............... 348/294, 302, 308, 374, 222.1
See application file for complete search history.

(56) References Cited

U.S. PATENT DOCUMENTS

| 2004/0145508 | A1 | 7/2004 | Gulati et al. | |
|---|---|---|---|---|
| 2005/0184895 | A1* | 8/2005 | Petersen et al. | 341/143 |
| 2009/0261998 | A1 | 10/2009 | Chae et al. | |
| 2009/0309991 | A1 | 12/2009 | Lim et al. | |
| 2011/0069211 | A1* | 3/2011 | Jung et al. | 348/294 |
| 2013/0009795 | A1* | 1/2013 | Soenen et al. | 341/110 |

FOREIGN PATENT DOCUMENTS

KR  1020090128596 A  12/2009

OTHER PUBLICATIONS

Youssef H. Atris, Design of RSD-Cyclic and Hybrid RSD-Cyclic/Sigma-Delta ADS's, MSEE Electrical Engineering, Jul. 2007, 253, Wichita State University, Wichita, Kansas.

* cited by examiner

*Primary Examiner* — Gevell Selby
(74) *Attorney, Agent, or Firm* — William Park & Associates Patent Ltd.

(57) ABSTRACT

The analog-to-digital converter includes a signal processing unit generating an operational amplifier output voltage in response to an input voltage and a DAC output voltage in a first period and generating the operational amplifier output voltage in response to a feedbacked operational amplifier output voltage and the DAC output voltage in a second period; a control unit generating a DAC control signal by comparing the operational amplifier output voltage with a first reference voltage to obtain high order M-bits of data in the first period, and generating the DAC control signal by comparing the operational amplifier output voltage with second and third reference voltages to obtain low order N-bits of data in the second period; and a digital analog converter generating the DAC output voltage in response to the DAC control signal.

21 Claims, 21 Drawing Sheets

ANALOG-TO-DIGITAL CONVERTER, IMAGE SENSOR INCLUDING THE SAME, AND APPARATUS INCLUDING IMAGE SENSOR

CROSS-REFERENCE TO RELATED APPLICATIONS

This application claims the priority of Korean Patent Application No. 10-2011-0077012 filed on Aug. 2, 2011, in the Korean Intellectual Property Office, the disclosure of which is incorporated herein by reference in its entirety.

BACKGROUND OF THE INVENTION

1. Field of the Invention

Embodiments of the inventive concept relate to an analog-to-digital converter, an image sensor including the same, and an apparatus including the image sensor.

2. Description of the Related Art

In general, an electronic system such as an image sensor system or biosensor system includes an analog-to-digital converter (hereinafter, referred to as 'ADC') installed in every column in order to read a large amount of data at high speed.

Recently, demand for an ADC requiring high speed operations, high resolution, and low power consumption has increased due to the development of an image sensor such as a complementary metal oxide semiconductor image sensor (CIS), a charge coupled device (CCD), or the like, as well as the development of various communications technologies.

As generally used ADCs, there are various types of ADCs including but not limited to a sigma-delta ADC, a cyclic ADC, and the like.

Since a sigma-delta ADC has noise-shaping characteristics, it can be used as an ADC having adequate high-resolution. However, since the sigma-delta ADC requires a large number of clocks for the operation thereof, there is a need to operate an operational amplifier having an integrator configured within the sigma-delta ADC at high speeds in order to operate the sigma-delta ADC at a high speed. As a result, in the case in which the sigma-delta ADC is used for operating at a high speed, power consumption thereof may be increased. In addition, due to the number of clocks in the sigma-delta ADC being increased, internal circuits therein may occupy a relatively large area.

In the case of a cyclic ADC, as compared to that of the sigma-delta ADC, the number of clocks necessary for obtaining the same level of resolution is relatively small. Thus, it is easy to implement an ADC able to operate at high speed. However, in the cyclic ADC, in order to reduce an effect of thermal noise generated at the time of sampling, a large capacity sampling capacitor is needed. Therefore, a cyclic ADC requires a relatively large area, and power consumption may also be increased. In order to implement an ADC having a relatively high resolution, the cyclic ADC needs to include an operational amplifier having a large gain.

SUMMARY OF THE INVENTION

One or more embodiments may provide an ADC having high speed, a low area, and high resolution.

One or more embodiments may provide an image sensor having the ADC.

One or more embodiments may provide an apparatus including the image sensor having the ADC.

According to an aspect of the inventive concept, there is provided an analog-to-digital converter including: a signal processing unit generating an operational amplifier output voltage in response to an input voltage and a digital analog converter (DAC) output voltage in a sigma-delta operating period and generating the operational amplifier output voltage in response to a feedbacked operational amplifier output voltage and the DAC output voltage in a cyclic operating period; a control unit generating a DAC control signal by comparing the operational amplifier output voltage with a first reference voltage in the sigma-delta operating period and obtaining high order M-bits of data, and generating the DAC control signal by comparing the operational amplifier output voltage with second and third reference voltages in the cyclic operating period and obtaining low order N-bits of data; and a digital analog converter generating the DAC output voltage in response to the DAC control signal.

According to another aspect of the inventive concept, there is provided an image sensor including: a pixel unit including at least one pixel outputting an analog signal according to light input from an outside; and an analog digital conversion unit including at least one analog-to-digital converter converting the analog signal into a digital signal, the at least one analog-to-digital converter including a signal processing unit generating an operational amplifier output voltage in response to the analog signal and a DAC output voltage in a sigma-delta operating period and generating the operational amplifier output voltage in response to a feedbacked operational amplifier output voltage and the DAC output voltage in a cyclic operating period; a control unit generating a DAC control signal by comparing the operational amplifier output voltage with a first reference voltage in the sigma-delta operating period and obtaining high order M-bits of data, and generating the DAC control signal by comparing the operational amplifier output voltage with second and third reference voltages in the cyclic operating period and obtaining low order N-bits of data; and a digital analog converter generating the DAC output voltage in response to the DAC control signal.

According to another aspect of the inventive concept, there is provided an apparatus including: the image sensor described above; an optical unit collecting light input from the outside and transferring the collected light to the pixel unit; and a data processing unit receiving the digital signal to process or store the received digital signal.

According to another aspect of the inventive concept, there is provided an analog-to-digital converter including: an internal circuit receiving an input signal and generating an output signal; a sigma-delta controller controlling to operate the internal circuit as a sigma-delta analog-to-digital converter when the input signal is input from an outside and obtaining high order M-bits of a digital signal among digital signals corresponding to the input signal by inputting the output signal thereto; and a cyclic controller controlling to operate the internal circuit as a cyclic analog-to-digital converter after obtaining the high order M-bits of the digital signal and obtaining low order N-bits of a digital signal among the digital signals by inputting the output signal thereto.

BRIEF DESCRIPTION OF THE DRAWINGS

The above and other aspects, features and other advantages of the inventive concept will be more clearly understood from the following detailed description taken in conjunction with the accompanying drawings, in which.

DETAILED DESCRIPTION OF THE EMBODIMENTS

Figure 1:
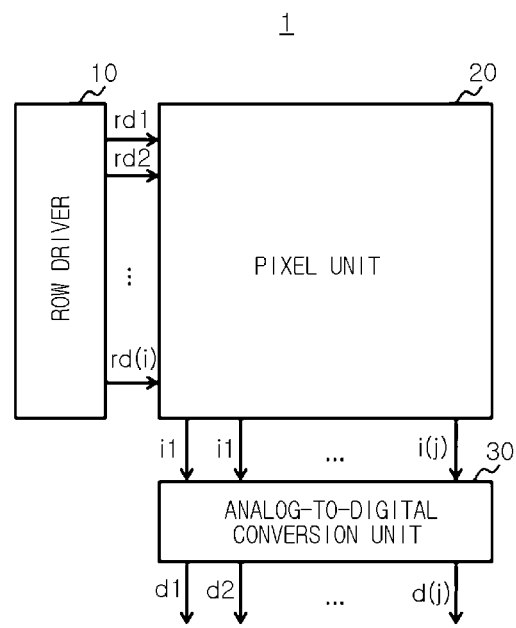
FIG. 1 is a block diagram of an image sensor including an ADC according to an embodiment of the inventive concept.

Embodiments of the inventive concept will now be described in detail with reference to the accompanying drawings, such that those having ordinary skill in the art to which the invention pertains can easily implement the embodiments described herein. However, it should be noted that the spirit of the present invention is not limited to the embodiments set forth herein and that those skilled in the art and understanding the inventive concept could easily accomplish retrogressive inventions or other embodiments included in the spirit of the present invention by the addition, modification, and removal of components within the same spirit, but those are to be construed as being included in the spirit of the present invention.

In addition, like or similar reference numerals denote parts performing similar functions and actions throughout the drawings.

In addition, unless explicitly described to the contrary, "comprising" any components will be understood to imply the inclusion of other components but not the exclusion of any other components.

FIG. 1 is a block diagram of an image sensor 1 including an ADC according to an embodiment of the inventive concept. The image sensor 1 according to an embodiment of the inventive concept may include a row driver 10, a pixel unit 20 and an analog-digital conversion unit 30.

Hereinafter, respective functions of the blocks shown in FIG. 1 will be described.

The row driver 10 may output row driving signals rd1, rd2, ..., and rd(i) driving pixels constituting a selected row of the pixel unit 20. The row driver 10 may activate one of row driving signals rd1, rd2, ..., rd(i) in response to a row address input from the outside, and may also sequentially activate the row driving signals rd1, rd2, ..., rd(i) in response to a clock signal and a control signal input from the outside.

The pixel unit 20 may output a plurality of analog signals i1, i2, ..., i(j) in response to the row driving signals rd1, rd2, ..., rd(i). The pixel unit 20 may include a plurality of pixels (not shown) disposed in matrix form. The plurality of respective pixels (not shown) may sense light by using a light sensing device and may output an electric signal corresponding to sensed light as one of the plurality of analog signals i1, i2, ..., i(j). Here, among the plurality of pixels, pixels constituting one row may be activated in response to a corresponding row driving signal among the row driving signals rd1, rd2, ..., rd(i).

The analog-digital conversion unit 30 may receive the plurality of analog signals i1, i2, ..., i(j), and may output a plurality of digital signals d1, d2, ..., d(j) respectively corresponding to the plurality of analog signals i1, i2, ..., i(j). The analog-digital conversion unit 30 may include the j-number of ADCs receiving the plurality of respective analog signals i1, i2, ..., i(j). That is, the analog-digital conversion unit 30 may include a plurality of ADCs provided on every column of the pixel unit 20.

Figure 2:
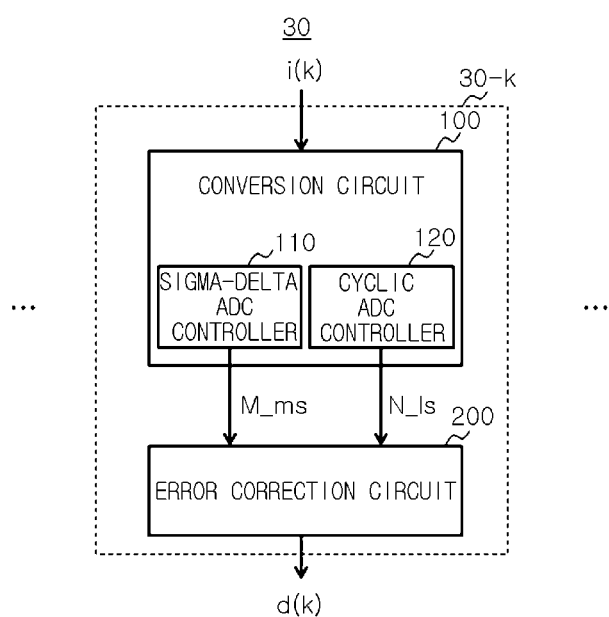
FIG. 2 is a block diagram of an analog-to-digital conversion unit of the image sensor shown in FIG. 1 according to the embodiment of the inventive concept.

FIG. 2 is a block diagram of the analog-to-digital conversion unit 30 of the image sensor 1 shown in FIG. 1, according to the embodiment of the inventive concept. As described above, the analog-to-digital conversion unit 30 may include a plurality of ADCs (for example, the j-number of ADCs), and each of the plurality of ADCs may be configured in the same manner as that of an ADC 30-$k$ shown in FIG. 2. The ADC 30-$k$ according to the embodiment of the inventive concept may include a conversion circuit 100 and an error correction circuit 200, and the conversion circuit 100 may include a sigma-delta ADC controller 110 and a cyclic ADC controller 120.

Respective functions of the blocks shown in FIG. 2 will be described below.

The conversion circuit 100 may receive a corresponding analog signal i(k) among the analog signals i1, i2, ..., i(j)) to perform a sigma-delta ADC operation and thus obtain high order M-bits of data M_ms of the digital signal d(k) corresponding to the analog signal i(k) and to perform a cyclic ADC operation and thus obtain low order N-bits of data N_ls of the digital signal d(k). The conversion circuit 100 may include a sigma-delta ADC controller 110 obtaining and outputting the high order M-bits of data M_ms and a cyclic ADC controller 120 obtaining and outputting the low order N-bits of data N_ls.

The error correction circuit 200 may receive the high order M-bits of data M_ms and the low order N-bits of data N_ls and output the digital signal d(k). The digital signal d(k) may be a signal having M+N bits. The error correction circuit 200 may perform an arithmetic operation for compensating for an error occurring due to an offset of a comparator (not shown) inside the conversion circuit 100. For example, the error correction circuit 200 may receive the high order M-bits of data M_ms and the low order N-bits of data N_ls, generate M+N−1 bits of first digital data (M_ms(M) M_ms(M−1) ... M_ms(1) 0 0 ... 0) in which high order M-bits thereof are the same as the high order M-bits of data M_ms, and M+N−1 bits of second digital data (0 0 ... 0 N_ls(N) N_ls(N−1) ... N_ls(1)) in which low order N-bits thereof are the same as the low order N-bits of data N_ls, and then add the first digital data and the second digital data to output the M+N bits of digital signal d(k). Here, each M_ms(M), M_ms(M−1), ..., M_ms(1) refers to each bit of the high order M-bits of data M_ms, and each N_ls(N), N_ls(N−1), ..., N_ls(1) refers to each bit of the low order N-bits of data N_ls. As a result, low order (N−1) bits of data of the M+N bits of digital signal d(k) may be the same as low order (N−1) bits of data (N_ls(N−1), ..., N_ls(1)) of the low order N-bits of data N_ls, and high order (M+1) bits of data in the M+N bits of digital signal d(k) may be data obtained by adding highest order bit data N_ls(N) of the low order N-bits of data N_ls to the high order M-bits of data M_ms.

Figure 3:
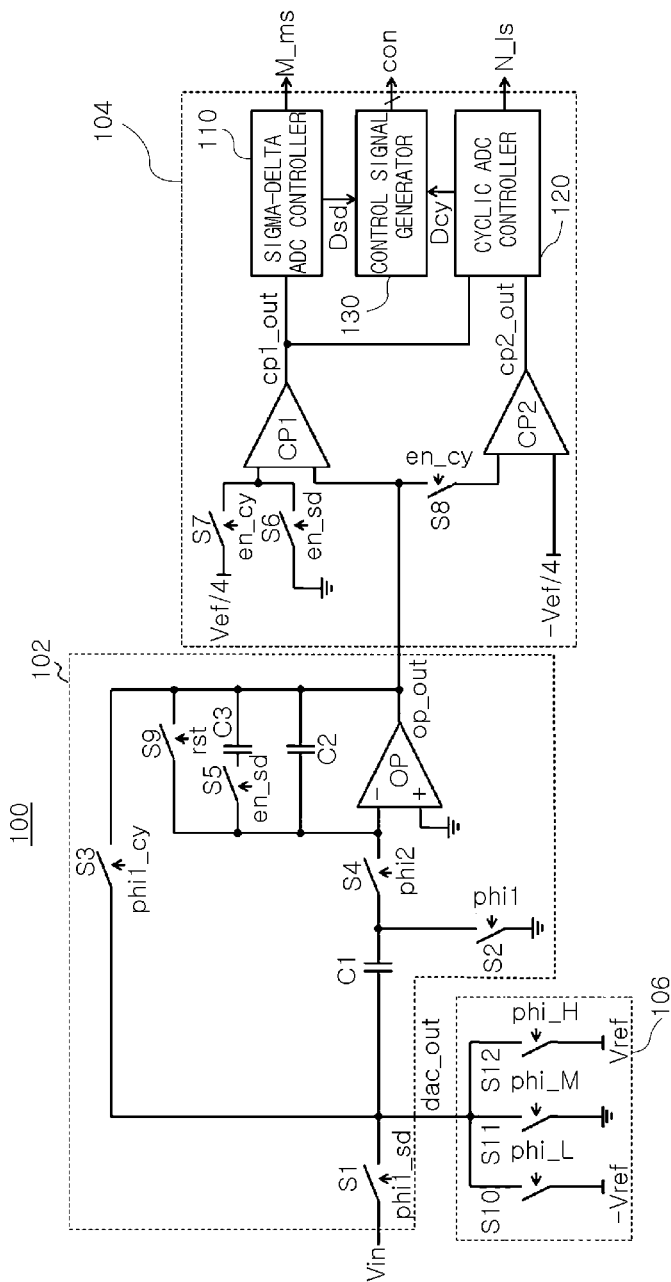
FIG. 3 illustrates a configuration of a conversion circuit of an ADC shown in FIG. 2 according to a first embodiment of the inventive concept.

FIG. 3 illustrates a configuration of the conversion circuit 100 of the ADC 30-$k$ shown in FIG. 2, according to a first embodiment of the inventive concept. The conversion circuit 100 according to the first embodiment may include a signal processing unit 102, a control unit 104 and a digital analog converter (hereinafter, referred to as "DAC") 106. In FIG. 3, Vin refers to an input voltage of an analog signal i(k) input to the ADC 30-$k$.

The signal processing unit 102 may include switches S1, S2, S3, S4, S5 and S9, a sampling capacitor C1, a first feedback capacitor C2, a second feedback capacitor C3, and an operational amplifier OP. A ground voltage may be connected to a first input terminal, for example, a non-inverted input terminal, of the operational amplifier OP. The switch S1 may be connected between a terminal to which an input voltage Vin is input and an output terminal of the DAC 106, and may be turned on and off in response to a first control signal phi1_sd. One side of the sampling capacitor C1 may be connected to a DAC output node. The switch S2 may be connected between the other side of the sampling capacitor C1 and the ground voltage, and may be turned on and off in response to a second control signal phi1. The switch S3 may be connected between an output terminal of the DAC 106 and an output terminal of the operational amplifier OP, and may be turned on and off in response to a third control signal phi1_cy. The switch S4 may be connected between the other side of the sampling capacitor C1 and a second input terminal, for example, an inverted input terminal, of the operational amplifier OP, and may be turned on and off in response to a fourth control signal phi2. The first feedback capacitor C2 may be connected between the second input terminal of the operational amplifier OP and the output terminal of the operational amplifier OP. One side of the switch S5 may be connected to the second input terminal of the operational amplifier OP, and may be turned on and off in response to a sigma-delta enable signal en_sd. The second feedback capacitor C3 may be connected between the other side of the switch S5 and the output terminal of the operational amplifier OP. The switch S9 may be connected between the second input terminal of the operational amplifier OP and the output terminal of the operational amplifier OP, and may be turned on and off in response to a reset signal rst. The sampling capacitor C1, the first feedback capacitor C2 and the second feedback capacitor C3 may have the same capacitance.

The control unit 104 may include switches S6, S7 and S8, a first comparator CP1, a second comparator CP2, a sigma-delta ADC controller 110, a cyclic ADC controller 120, and a control signal generator 130. The first input terminal of the first comparator CP1 may be connected to an output terminal of the operational amplifier OP of the signal processing unit 102. The switch S6 may be connected between a ground voltage and a second input terminal of the first comparator CP1, and may be turned on and off in response to a sigma-delta enable signal en_sd. The switch S7 may be connected between a first reference voltage Vref/4 and the second input terminal of the first comparator CP1, and may be turned on and off in response to a cyclic enable signal en_cy. A second input terminal of the second comparator CP2 may have a second reference voltage −Vref/4 applied thereto. The switch S8 may be connected between the output terminal of the operational amplifier OP and the first input terminal of the second comparator CP2, and may be turned on and off in response to the cyclic enable signal en_cy.

The DAC 106 may include switches S10, S11 and S12. The switch S10 may be connected between a third reference voltage −Vref and a DAC output node, and may be turned on and off in response to a first DAC control signal phi_L. The switch S11 may be connected between a ground voltage and a DAC output node, and may be turned on and off in response to a second DAC control signal phi_M. The switch S12 may be connected between a fourth reference voltage Vref and a DAC output node, and may be turned on and off in response to a third DAC control signal phi_H.

The third reference voltage −Vref may have a voltage level equal to four times that of the second reference voltage −Vref/

4, and the fourth reference voltage Vref may have a voltage level equal to four times that of the first reference voltage Vref/4. In addition, the magnitudes of the third reference voltage −Vref and the fourth reference voltage Vref may be determined by a magnitude of the input voltage Vin that can be input. For example, the magnitudes of the third reference voltage −Vref and the fourth reference voltage Vref may have a maximum value of the input voltage Vin that can be input.

Respective functions of the blocks shown in FIG. 3 will be described below.

The signal processing unit 102 may generate an operational amplifier output voltage op_out in response to an input voltage Vin and a DAC output voltage dac_out in a sigma-delta operating period, and may generate the operational amplifier output voltage op_out in response to a feedbacked operational amplifier output voltage op_out and the DAC output voltage dac_out in a cyclic ADC operating period.

The control unit 104 may compare the output voltage op_out of the operational amplifier OP with a ground voltage in the sigma-delta ADC operating period, and may output the first to third DAC control signals phi_L, phi_M and phi_H according to comparison results, to thus obtain high order M-bits of data M_ms. In addition, the control unit 104 may compare the output voltage op_out of the operational amplifier OP with the first and second reference voltages Vref/4 and −Vref/4 in the cyclic ADC operating period, and may output the first to third DAC control signals phi_L, phi_M and phi_H according to comparison results to thus obtain low order N-bits of data N_ls. Further, the control unit 104 may output control signals con. The control signals con may include the first to fourth control signals phi1_sd, phi1, phi1_cy and phi2, the reset signal rst, the sigma-delta enable signal en_sd, and the cyclic enable signal en_cy. In this case, the control unit 104 may output the control signals con in response to a clock signal applied from the outside.

The first comparator C1 may compare the ground voltage and the operational amplifier output voltage op_out in the sigma-delta ADC operating period to output a first comparator output signal cp1_out, and may compare the first reference voltage Vref/4 with the operational amplifier output voltage op_out in the cyclic ADC operating period to output the first comparator output signal cp1_out. The second comparator CP2 may compare the second reference voltage −Vref/4 with the operational amplifier output voltage op_out in the cyclic ADC operating period to output a second comparator output signal cp2_out. The second comparator CP2 may be inactivated in the sigma-delta ADC operating period.

The sigma-delta ADC controller 110 may generate a first digital signal Dsd in response to the first comparator output signal cp1_out, and may obtain and output high order M-bits of data M_ms. When the first comparator output signal cp1_out indicates that the operational amplifier output voltage op_out has a voltage level lower than that of the ground voltage, the sigma-delta ADC controller 110 may generate a first digital signal Dsd having a value of "−1". When the first comparator output signal cp1_out indicates that the operational amplifier output voltage op_out has a voltage level equal to or higher than the ground voltage, the sigma-delta ADC controller 110 may generate a first digital signal Dsd having a value of "1". In addition, the sigma-delta ADC controller 110 may obtain the high order M-bits of data M_ms by using sequentially generated first digital signals Dsd. The sigma-delta ADC controller 110 may be activated in the sigma-delta ADC operating period and may be inactivated in the cyclic ADC operating period.

The cyclic ADC controller 120 may generate a second digital signal Dcy in response to the first comparator output signal cp1_out and the second comparator output signal cp2_out to obtain and output the low order N-bits of data N_ls. When the second comparator output signal cp2_out indicates that the operational amplifier output voltage op_out has a voltage level lower than that of the second reference voltage −Vref/4, the cyclic ADC controller 120 may generate a second digital signal Dcy having a value of "−1". When the second comparator output signal cp2_out indicates that the operational amplifier output voltage op_out has a voltage level equal to or higher than the second reference voltage −Vref/4, and when the first comparator output signal cp1_out indicates that the operational amplifier output voltage has a voltage level lower than that of the first reference voltage Vref/4, the cyclic ADC controller 120 may generate a second digital signal Dcy having a value of "1". In addition, the cyclic ADC controller 120 may obtain the low order N-bits of data N_ls by using sequentially generated second digital signals Dcy. The cyclic ADC controller 120 may be activated in the cyclic ADC operating period and may be inactivated in the sigma-delta ADC operating period.

The control signal generator 130 may output the first to third DAC control signals phi_L, phi_M and phi_H in response to the first digital signal Dsd and the second digital signal Dcy. The control signal generator 130 may only activate the first DAC control signal phi_L when the first digital signal Dsd has a value of "−1", and may only activate and output the third DAC control signal phi_H when the first digital signal Dsd has a value of "1". In addition, the control signal generator 130 may only activate the first DAC control signal phi_L when the second digital signal Dcy has a value of "−1", may only activate the second DAC control signal phi_M when the second digital signal Dcy is "0", and may only activate and output the third DAC control signal phi_H when the second digital signal Dcy has a value of "1". Further, the control signal generator 130 may only activate and output the second DAC control signal phi_M in an integration section of an initial clock cycle period and a sampling section of a final clock cycle period in the sigma-delta ADC operating period. The control signal generator 130 may also output the first to fourth control signals phi1_sd, phi1, phi1_cy and phi2, the reset signal rst, the sigma-delta enable signal en_sd and the cyclic enable signal en_cy in response to a clock signal input from the outside or a command input together with the clock signal. The DAC 106 may output a DAC output voltage dac_out to a DAC output terminal in response to the first to third DAC control signals phi_L, phi_M and phi_H. The DAC 106 may output the third reference voltage −Vref as the DAC output voltage dac_out when the first DAC control signal phi_L is activated, may output the ground voltage as the DAC output voltage dac_out when the second DAC control signal phi_M is activated, and may output the fourth reference voltage Vref as the DAC output voltage dac_out when the third DAC control signal phi_H is activated.

Figure 4:
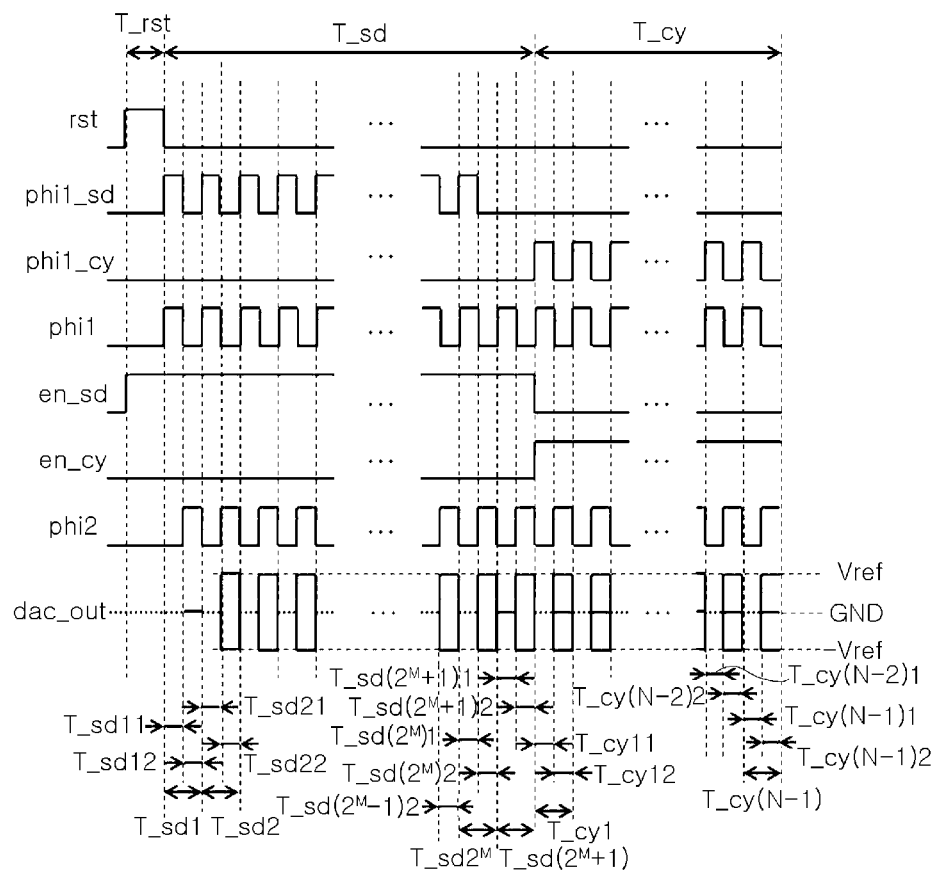
FIG. 4 is a timing diagram for explaining an operation of the conversion circuit of the ADC shown in FIG. 3 according to the first embodiment of the inventive concept.

FIG. 4 is a timing diagram for explaining an operation of the conversion circuit 100 of the ADC 30-k shown in FIGS. 2 and 3 according to the first embodiment of the inventive concept. In FIG. 4, rst refers to a reset signal, phi1_sd, phi1, phi1_cy and phi2 respectively refer to first to fourth control signals, en_sd refers to a sigma-delta enable signal, en_cy refers to a cyclic enable signal, phi_L (i.e., −Vref), phi_M (i.e., GND) and phi_H (i.e., Vref) respectively refer to first to third DAC control signals, and dac_out refers to a DAC output voltage. In FIG. 4, in waveform diagrams representing DAC output voltages, sections having dotted lines indicate that an output terminal of the DAC 106 is floated.

Among the signals, the sigma-delta enable signal en_sd may be activated during a sigma-delta ADC operating period T_sd, and the cyclic enable signal en_cy may be activated during a cyclic ADC operating period T_cy. Further, corresponding switches may be turned on in a period in which respective control signals have a high level, and corresponding switches may be turned off in a period in which respective control signals have a low level.

FIGS. 5 to 11 illustrate an operation of the conversion circuit 100 according to the first embodiment of the inventive concept in respective sections of the timing diagrams shown in FIG. 4.

Figure 5:
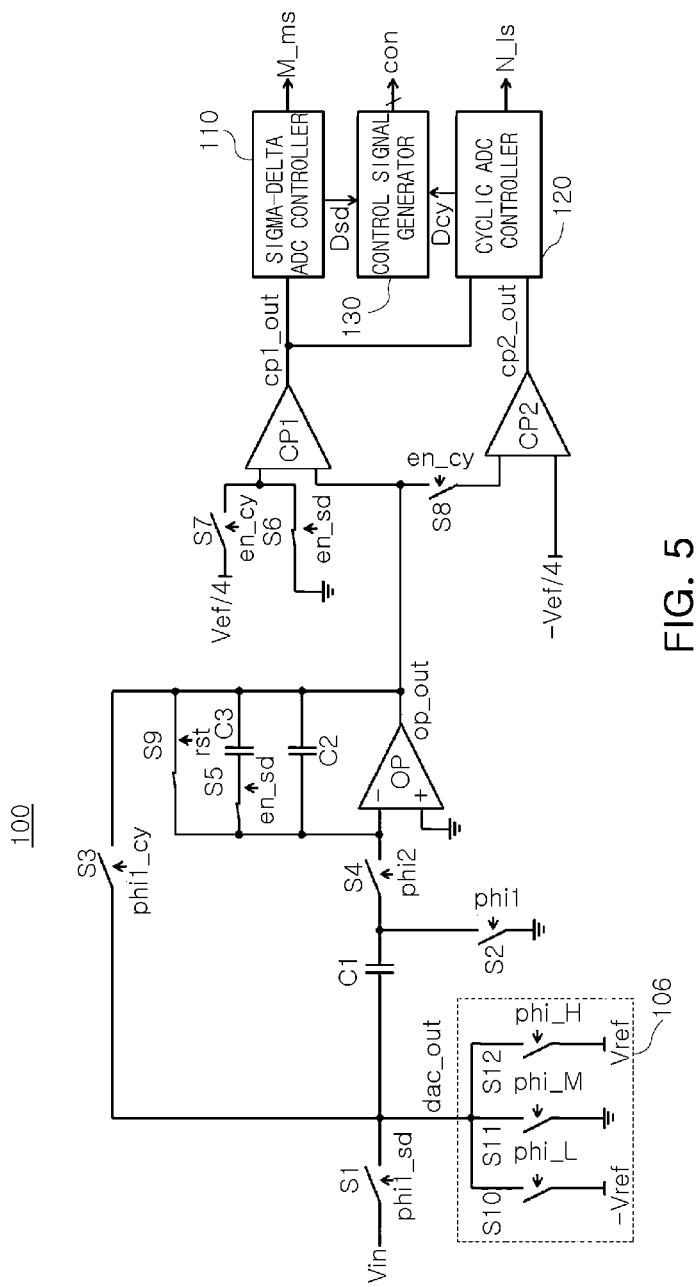
FIG. 5 explains an operation of the conversion circuit of the ADC Shown in FIG. 3, according to the first embodiment of the inventive concept, in a reset period of the operation timing diagram shown in FIG. 4.

FIG. 5 explains an operation of the conversion circuit 100 of the ADC shown in FIG. 3, according to the first embodiment of the inventive concept, in a reset period T_rst of the operation timing diagram shown in FIG. 4.

In the reset period T_rst, a reset signal rst and a sigma-delta enable signal en_sd may only be activated. Therefore, switches S5, S9, and S6 may only be turned on, and as a result, first and second feedback capacitors C2 and C3 may be discharged.

Although FIGS. 4 and 5 illustrate the case in which the first and second feedback capacitors C2 and C3 are discharged in a separate reset period, the conversion circuit 100 of the ADC 30-$k$ according to the embodiment of the inventive concept may also allow the first and second feedback capacitors C2 and C3 to be discharged in a first sampling section T_sd11 of the sigma-delta ADC operating period T_sd. In this case, by activating the reset signal rst in the first sampling section T_sd11 of the sigma-delta ADC operating period T_sd, the first and second feedback capacitors C2 and C3 may be discharged.

Figure 6:
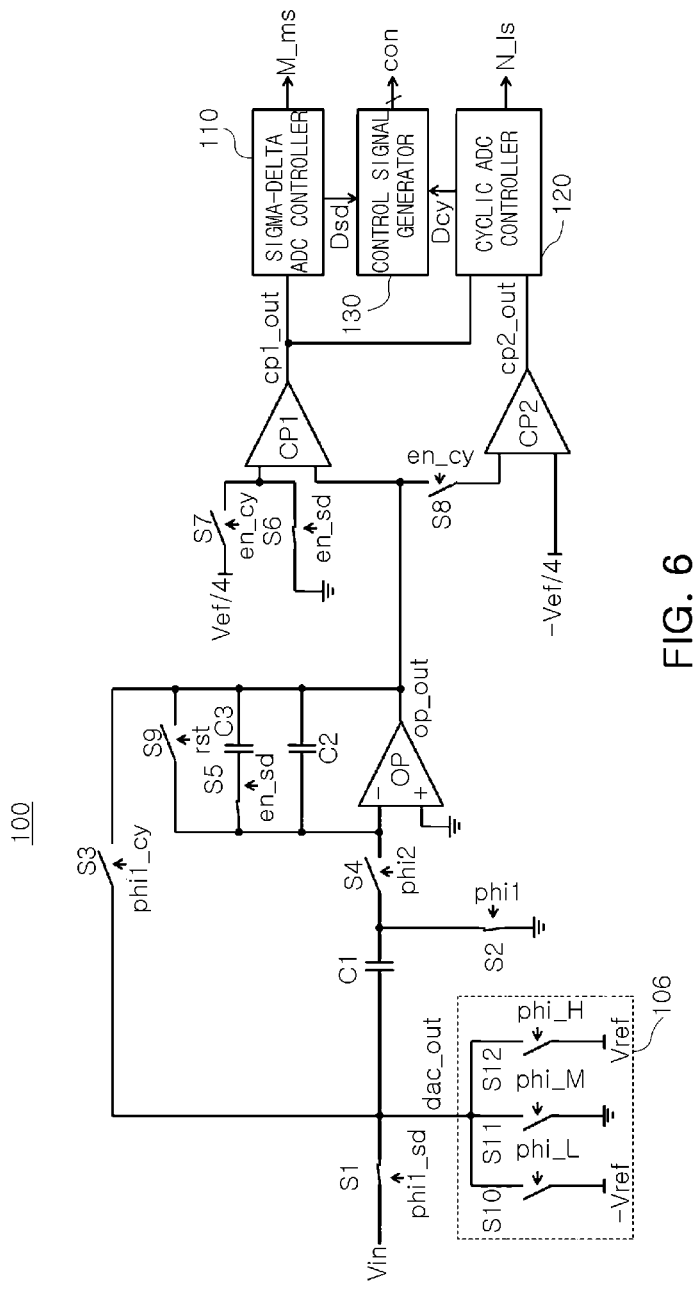
FIG. 6 explains an operation of the Conversion circuit of the ADC shown in FIG. 3, according to the first embodiment of the inventive concept, in a sampling section of a sigma-delta ADC operating period of the operation timing diagram shown in FIG. 4.

FIG. 6 explains an operation of the Conversion circuit 100 shown in FIG. 3, according to the first embodiment of the inventive concept, in sampling sections T_sd11, T_sd21, ..., T_sd($2^M$)1 of the sigma-delta ADC operating period T_sd of the operation timing diagram shown in FIG. 4.

A first control signal phi1_sd, a second control signal phi1, and a sigma-delta enable signal en_sd may be activated in the sampling sections T_sd11, T_sd21, ..., T_sd($2^M$)1 of the sigma-delta ADC operating period T_sd. Therefore, switches S1, S2, S5, and S6 may only be turned on. Here, an output terminal of the DAC 106 may be floated. Resultantly, an input voltage Vin may be stored in the sampling capacitor C1.

Figure 7:
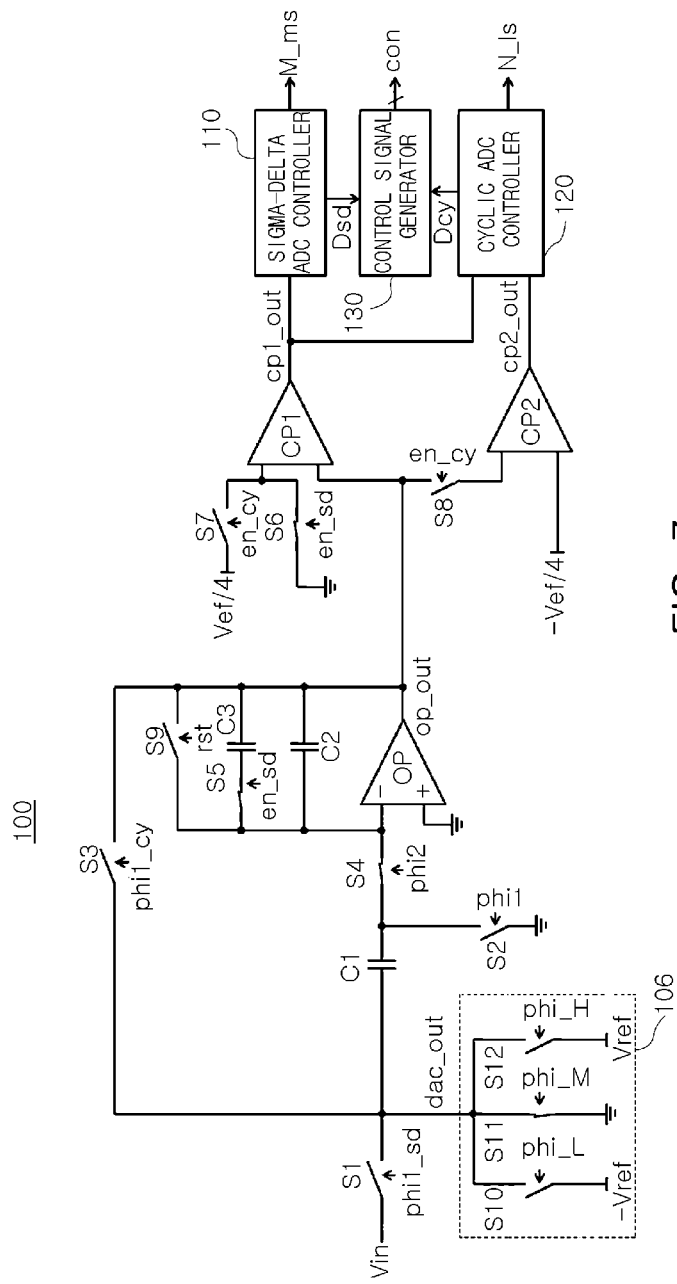
FIG. 7 explains an operation of the Conversion circuit of the ADC shown in FIG. 3, according to the first embodiment of the inventive concept, in a first integration section of a sigma-delta ADC operating period of the operation timing diagram shown in FIG. 4.

FIG. 7 explains an operation of the Conversion circuit 100 shown in FIG. 3, according to the first embodiment of the inventive concept, in a first integration section T_sd12 of the sigma-delta ADC operating period T_sd of the operation timing diagram shown in FIG. 4.

A fourth control signal phi2, a sigma-delta enable signal en_sd, and a second DAC control signal phi_M (i.e., GND) may be activated in the first integration section T_sd12 of the sigma-delta ADC operating period T_sd. Therefore, switches S4, S5, S6 and S11 may be turned on. Accordingly, a charge stored in the sampling capacitor C1 may be transmitted to the first and second feedback capacitors C2 and C3. As a result, in the first integration section T_sd12, charges corresponding to ½ of the input voltage Vin may be accumulated in each of the first and second feedback capacitors C2 and C3, and the operational amplifier output voltage op_out may be ½ of the input voltage Vin.

The first comparator CP1 may output the first comparator output signal cp1_out by comparing the operational amplifier output voltage op_out with a ground voltage. The sigma-delta ADC controller 110 may generate the first digital signal Dsd in response to the first comparator output signal cp1_out. In addition, the control signal generator 130 may determine whether to activate any signal among the first to third DAC control signals phi_L, phi_M and phi_H in a subsequent clock cycle with regard to the first digital signal Dsd. An operation of selecting a DAC control signal to be activated may be also performed in the same manner in subsequent integration sections T_sd22, ..., and T_sd($2^M$)2.

Figure 8:
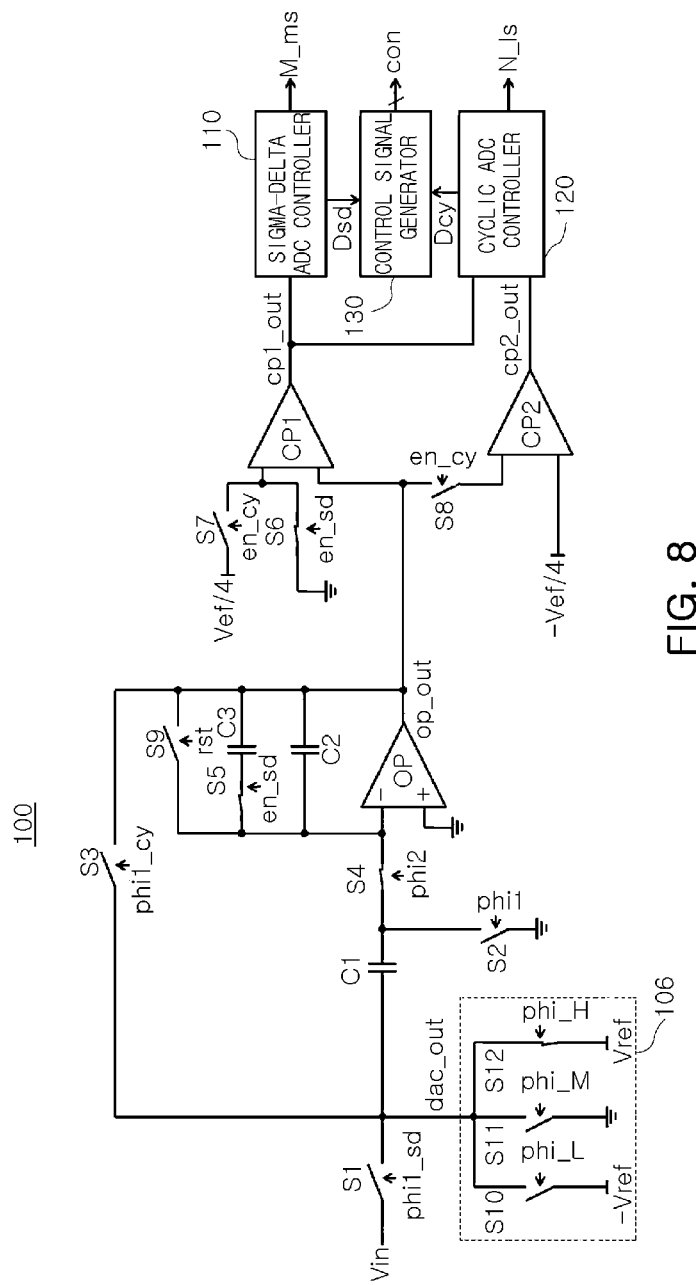
FIG. 8 explains an operation of the Conversion circuit of the ADC shown in FIG. 3, according to the first embodiment of the inventive concept, in second and subsequent integration sections of a sigma-delta ADC operating period of the operation timing diagram shown in FIG. 4.

FIG. 8 explains an operation of the Conversion circuit 100 of the ADC 30-$k$ shown in FIGS. 2 and 3, according to the first embodiment of the inventive concept, in the second and subsequent integration sections (T_sd22, ..., T_sd($2^M$)2, T_sd($2^M$+1)2) of the sigma-delta ADC operating period T_sd of the operation timing diagram shown in FIG. 4.

In the integration sections T_sd22, ..., T_sd($2^M$)2 and T_sd($2^M$+1)2, the fourth control signal phi2 and the sigma-delta enable signal en_sd may be activated, and a DAC control signal selected in previous integration sections T_sd12, ..., and T_sd($2^M$)2 among the first and third DAC control signals phi_L (i.e., −Vref) and phi_H (i.e., Vref) may be activated. FIG. 8 illustrates a case in which a third DAC control signal phi_H is selected in the previous integration section. Thus, in this case, switches S4, S5, S6 and S12 may only be switched on. In immediately previous sampling sections T_sd21, ..., and T_sd($2^M$)1, charges corresponding to the input voltage Vin may be accumulated in the sampling capacitor C1. Therefore, in the integration sections T_sd22, ..., and T_sd($2^M$)2, charges corresponding to a difference between the input voltage Vin and the fourth reference voltage Vref may be accumulated in the first and second feedback capacitors C2 and C3.

For example, when the first DAC control signal phi_L rather than the third DAC control signal phi_H is selected in the previous integration sections T_sd12, ..., and T_sd($2^M$−1)2, the switches S4, S5, S6, and S10 may only be turned on. In this case, in the integration sections T_sd22, ..., and T_sd($2^M$)2, charges corresponding to a difference between the input voltage Vin and the third reference voltage −Vref may be accumulated in the first and second feedback capacitors C2 and C3.

The first and second feedback capacitors C2 and C3 may have the same capacitance. When capacitance of the first feedback capacitor C2 and capacitance of the second feedback capacitor C3 are equal, ½ of a charge corresponding to a difference between the input voltage Vin and the third reference voltage −Vref may be accumulated in each of the first and second feedback capacitors C2 and C3.

In addition, the operational amplifier output voltage op_out in the integration sections (T_sd12, T_sd22, ..., T_sd($2^M$)2) of the sigma-delta ADC operating period T_sd may be represented by the following equation.

$$Vout2 = Vout1 + (Vin - Dsd \cdot Vref)/2 \quad \text{(Equation)}$$

In the above equation, Vout2 refers to an output voltage of the operational amplifier OP in a current integration section, Vout1 refers to an output voltage of the operational amplifier OP in a previous integration section, Vin refers to a voltage of an input voltage, and Dsd refers to a first digital signal determined in a previous integration section.

Figure 9:
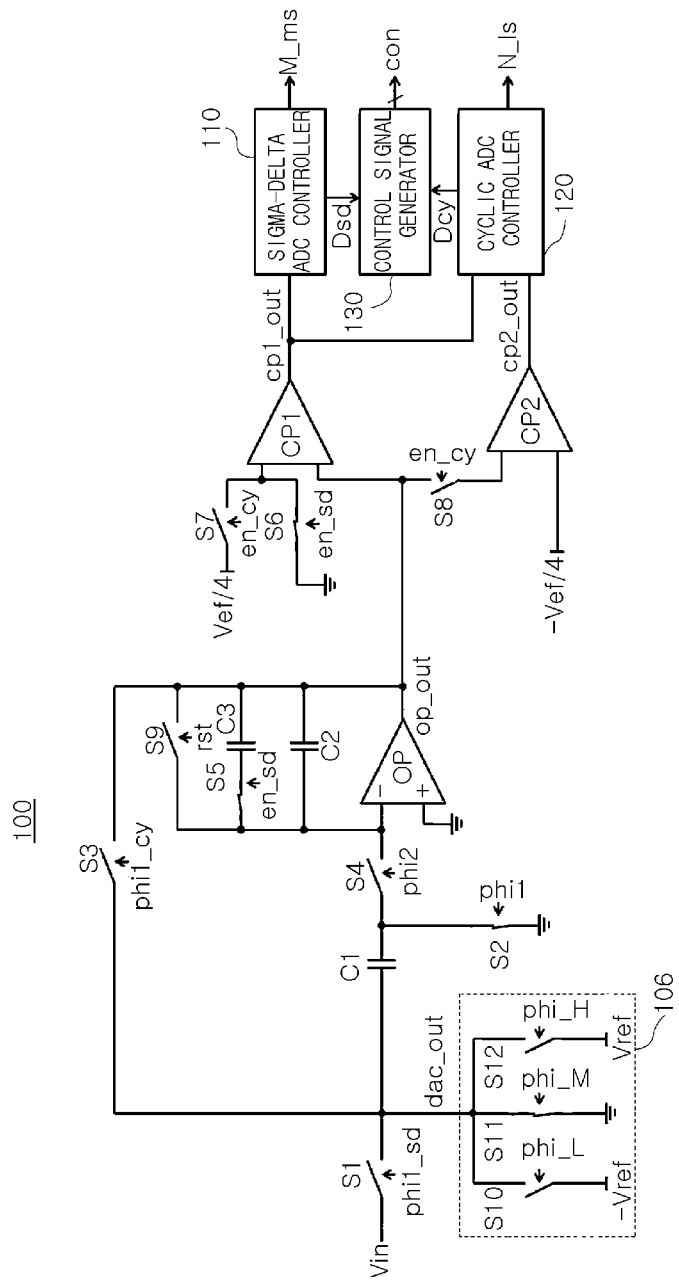
FIG. 9 explains an operation of the Conversion circuit of the ADC shown in FIG. 3, according to the first embodiment of the inventive concept, in a ground voltage sampling section of a sigma-delta ADC operating period of the operation timing diagram shown in FIG. 4.

FIG. 9 explains an operation of the Conversion circuit 100 of the ADC 30-$k$ shown in FIGS. 2 and 3, according to the first embodiment of the inventive concept, in a ground voltage sampling section T_sd($2^M$+1)1 of the sigma-delta ADC operating period T_sd of the operation timing diagram shown in FIG. 4.

In the ground voltage sampling section T_sd($2^M$+1)1, the second control signal phi1, the sigma-delta enable signal en_sd, and the second DAC control signal phi_M (i.e., GND) may be activated. Therefore, switches S2, S5, S6 and S11 may be turned on. As a result, the sampling capacitor C1 may be discharged.

Further, since the sampling capacitor C1 is discharged in the sampling section T_sd($2^M$+1)1, charges corresponding to a reference voltage selected from the third reference voltage −Vref and the fourth reference voltage Vref, may be accumulated in the first and second feedback capacitors C2 and C3 in the integration section T_sd($2^M$+1)2. When the first and second feedback capacitors C2 and C3 have the same capacitance, charges corresponding to ½ of the selected reference voltage may be accumulated in each of the first and second feedback capacitors C2 and C3.

During the sigma-delta ADC operating period T_sd, the conversion circuit 100 according to the first embodiment of the inventive concept may perform the operation explained with respect to FIG. 7 once, and then, may repeatedly perform the operation explained with respect to FIGS. 6 and 8 $2^M$−1 times, and further, may perform the operation explained with respect to FIGS. 8 and 9 once. Resultantly, when the operation in the sigma-delta ADC operating period T_sd is completed, charges corresponding to a voltage determined by the following equation may be accumulated in each of the first and second feedback capacitors C2 and C3.

$$(2^M * Vin - (Dsd1 * Vref + Dsd2 * Vref + \ldots + Dsd(2^M) * Vref))/2 \quad \text{(Equation)}$$

In the above-mentioned equation, respective Dsd1, Dsd2, ..., and Dsd($2^M$) refer to a first digital signal determined in integration sections T_sd11, T_sd22, ..., and T_sd($2^M$)2.

Resultantly, charges corresponding to a voltage obtained by deducting a voltage corresponding to high order M-bits of data M_ms acquired by the sigma-delta ADC controller 110, from an input voltage Vin, may be accumulated in each of the first and second feedback capacitors C2 and C3.

In addition, the sigma-delta ADC controller 110 may obtain the high order M-bits of data M_ms by using the above-mentioned first digital signals Dsd1, Dsd2, ..., Dsd($2^M$).

Figure 10:
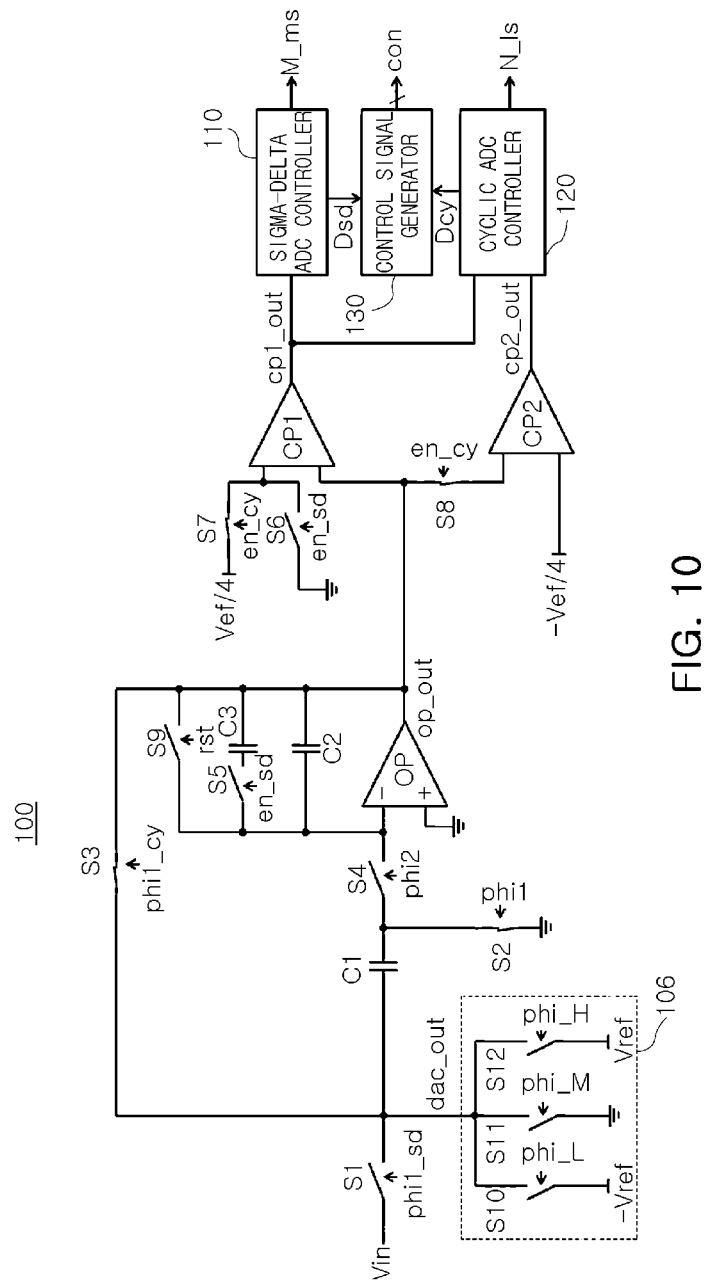
FIG. 10 explains an operation of the Conversion circuit of the ADC shown in FIG. 3, according to the first embodiment of the inventive concept, in a sampling section of a cyclic ADC operating period of the operation timing diagram shown in FIG. 4.

FIG. 10 explains an operation of the Conversion circuit 100 of the ADC 30-k shown in FIGS. 2 and 3, according to the first embodiment of the inventive concept, in sampling sections T_cy11, and T_cy(N−1)1 of the cyclic ADC operating period T_cy of the operation timing diagram shown in FIG. 4.

In the sampling sections T_cy11, ..., and T_cy(N−1)1, the second control signal phi1, the third control signal phi1_cy, and the cyclic enable signal en_cy may be activated. Therefore, only switches S2, S3, S7 and S8 may be activated. Since switch S5 is turned off, the second feedback capacitor C3 may not affect the circuit any more. As a result, the operational amplifier output signal op_out may be stored in the sampling capacitor C1. Here, the operational amplifier output signal op_out may have a voltage corresponding to a charge stored in the first feedback capacitor C2. Further, the magnitude of charge stored in the first feedback capacitor C2 may not be changed.

Further, in the first sampling section T_cy11, the first comparator CP1 may compare the first reference voltage Vref/4 and the operational amplifier output signal op_out to thus output the first comparator output signal cp1_out, and the second comparator CP2 may compare the second reference voltage −Vref/4 and the operational amplifier output signal op_out to thus output the second comparator output signal cp2_out. The cyclic ADC controller 120 may output the second digital signal Dcy in response to the first and second comparator output signals cp1_out and cp2_out, and the control signal generator 130 may selectively activate one of the first to third DAC control signals phi_L, phi_M and phi_H in response to the second digital signal Dcy.

Figure 11:
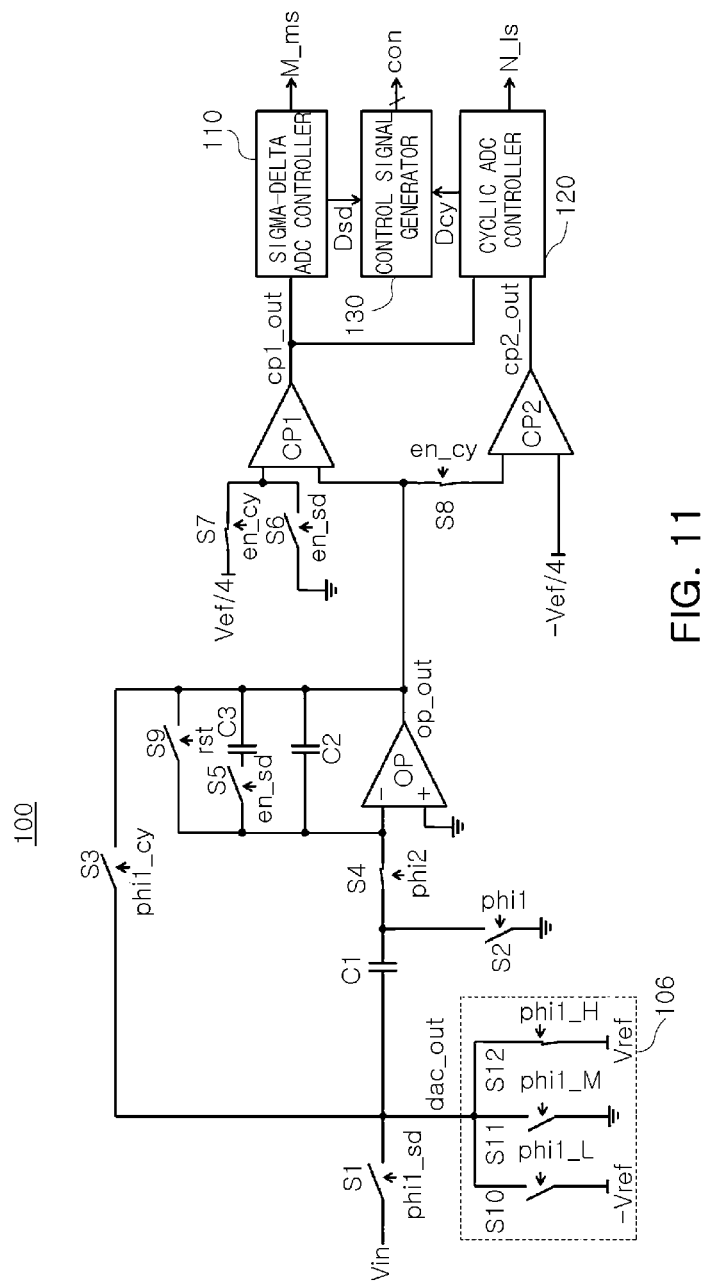
FIG. 11 explains an operation of the Conversion circuit of the ADC shown in FIG. 3, according to the first embodiment of the inventive concept, in an amplification section of a cyclic ADC operating period of the operation timing diagram shown in FIG. 4.

FIG. 11 explains an operation of the Conversion circuit 100 of the ADC 30-k shown in FIGS. 2 and 3, according to the first embodiment of the inventive concept, in amplification sections T_cy12, ..., and T_cy(N−1)2 of the cyclic ADC operating period T_cy of the operation timing diagram shown in FIG. 4.

In the amplification sections T_cy12, ..., and T_cy(N−1)2, the fourth control signal phi2 and the cyclic enable signal en_cy may be activated. Therefore, switches S4, S7 and S8 may be turned on. The DAC 106 may output a DAC output voltage dac_out in response to the first to third DAC control signals phi_L, phi_M and phi_H. Although FIG. 11 illustrates the case in which the third DAC control signal phi_H is activated to output the fourth reference voltage Vref as the DAC output voltage dac_out, the DAC 106 may also output the third reference voltage −Vref or the ground voltage as the DAC output voltage dac_out.

Here, the operational amplifier output voltage op_out in the previous sampling operating periods T_cy11, and T_cy(N−2)1 may be stored in the sampling capacitor C1. As a result, in the amplification sections T_cy12, ..., and T_cy(N−1)2, charges corresponding to a difference between the operational amplifier output voltage op_out and a selected reference voltage, that is, the third reference voltage −Vref, the ground voltage, or the fourth reference voltage Vref, may be accumulated in the first feedback capacitor C2.

The first and second comparators CP1 and CP2 may respectively compare the operational amplifier output voltage op_out and the respective first and second reference voltages Vref/4 and −Vref/4 to thus output the first and second comparator output signals cp1_out and cp2_out. The cyclic ADC controller 120 may generate the second digital signal Dcy in response to the first and second comparator output signals cp1_out and cp2_out. The control signal generator 130 may output the first to third DAC control signals phi_L, phi_M and phi_H in response to the second digital signal Dcy. The description above can be easily understood with reference to the description of FIG. 3.

Accordingly, the operational amplifier output voltage op_out in the amplification sections T_cy12, and T_cy(N−1)2 may be determined by the following equation.

$$Vout2 = 2 * Vout1 - Dcy * Vref \quad \text{(Equation)}$$

In the above-mentioned equation, Vout2 refers to an operational amplifier output voltage op_out in a current amplifier section, Vout1 refers to an operational amplifier output voltage op_out in an immediately previous amplification section, and Dcy refers to a second digital signal determined in a previous amplification section.

The conversion circuit 100 according to the first embodiment of the inventive concept may repeatedly perform the operation explained with respect to FIGS. 10 and 11 N−1 times. Further, the cyclic ADC controller 120 may generate and output low order N-bits of data N_ls by using the N−1 number of second digital signals Dcy generated from the first to N−1 numbered amplification operations. Here, each of the N−1 number of second digital signals Dcy may be 2 bit data. In addition, the cyclic ADC controller 120 may compensate for an offset error of a p−1 numbered generated second digital signal Dcy(p−1) by using a p-numbered (p is an integer equal to or greater than 2 and equal to or less than N−1) generated second digital signal Dcy(p), and may extract respective bit data of the low order N-bits of data N_ls from the second digital signal that has been compensated for the offset error.

The error correction circuit 200 may receive the high order M-bits of data M_ms and the low order N-bits of data N_ls to output M+N bits of resultant data.

Figure 12:
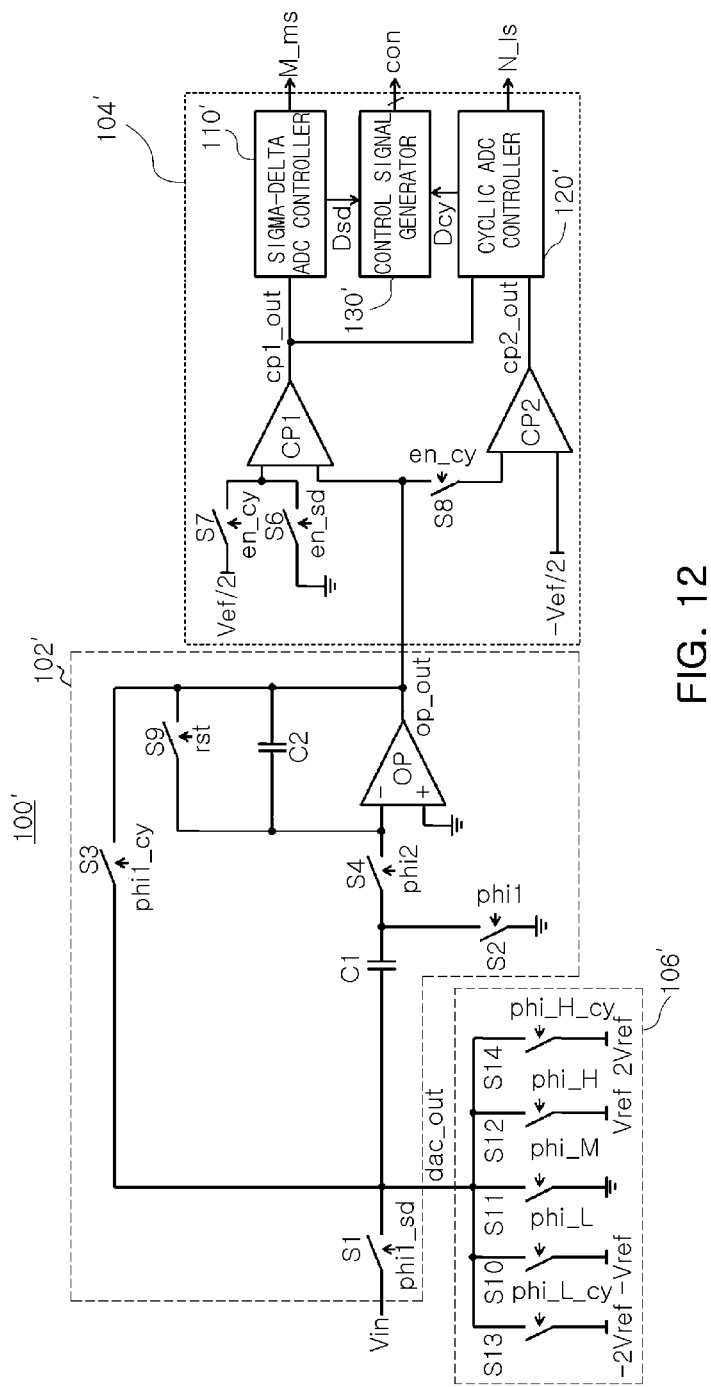
FIG. 12 illustrates a configuration of a conversion circuit of the ADC shown in FIG. 2, according to a second embodiment of the inventive concept.

FIG. 12 illustrates a configuration of a conversion circuit 100' of the ADC 30-*k* shown in FIG. 2, according to a second embodiment of the inventive concept. The conversion circuit 100' according to the second embodiment of the inventive concept may include a signal processing unit 102', a control unit 104' and a DAC 106' in a similar manner to that of the conversion circuit 100 according to the first embodiment of the inventive concept. In FIG. 12, Vin refers to a voltage of an analog signal i(k).

The signal processing unit 102' may include switches S1, S2, S3, S4, and S9, a sampling capacitor C1, a feedback capacitor C2, and an operational amplifier OP. A ground voltage may be connected to a first input terminal, for example, a non-inverted input terminal, of the operational amplifier OP. The switch S1 may be connected between a terminal, an input voltage Vin inputted thereto and a DAC output terminal, and may be turned on and off in response to a first control signal phi1_sd. One side of the sampling capacitor C1 may be connected to the DAC output terminal. The switch S2 may be connected between the other side of the sampling capacitor C1 and the ground voltage, and may be turned on and off in response to a second control signal phi1. The switch S3 may be connected between an output terminal of the DAC 106 and an output terminal of the operational amplifier OP, and may be turned on and off in response to a third control signal phi1_cy. The switch S4 may be connected between the other side of the sampling capacitor C1 and a second input terminal, for example, an inverted input terminal, of the operational amplifier OP, and may be turned on and off in response to a fourth control signal phi2. The first feedback capacitor C2 may be connected between the second input terminal of the operational amplifier OP and the output terminal of the operational amplifier OP. The switch S9 may be connected between the second input terminal of the operational amplifier OP and the output terminal of the operational amplifier OP, and may be turned on and off in response to a reset signal rst. The sampling capacitor C1 and the first feedback capacitor C2 may have the same capacitance.

The control unit 104' may include switches S6, S7 and S8, a first comparator CP1, a second comparator CP2, a sigma-delta ADC controller 110', a cyclic ADC controller 120' and a control signal generator 130'. A first input terminal of the first comparator CP1 may be connected to an output terminal of the operational amplifier OP of the signal processing unit 102'. The switch S6 may be connected between a ground voltage and a second input terminal of the first comparator CP1, and may be turned on and off in response to a sigma-delta enable signal en_sd. The switch S7 may be connected between a first reference voltage Vref/2 and the second input terminal of the first comparator CP1 and may be turned on and off in response to a cyclic enable signal en_cy. A second input terminal of the second comparator CP2 may have a second reference voltage −Vref/2 applied thereto. The switch S8 may be connected between the output terminal of the operational amplifier OP and the first input terminal of the second comparator CP2 and may be turned on and off in response to the cyclic enable signal en_cy.

The DAC 106' may include switches S10, S11, S12, S13, and S14. The switch S10 may be connected between a third reference voltage −Vref and a DAC output node, and may be turned on and off in response to a first DAC control signal phi_L. The switch S11 may be connected between a ground voltage and a DAC output node and may be turned on and off in response to a second DAC control signal phi_M. The switch S12 may be connected between a fourth reference voltage Vref and a DAC output node and may be turned on and off in response to a third DAC control signal phi_H. The switch S13 may be connected between a fifth reference voltage −2Vref and a DAC output node and may be turned on and off in response to a fourth DAC control signal phi_L_cy. The switch S14 may be connected between a sixth reference voltage 2Vref and a DAC output node and may be turned on and off in response to a fifth DAC control signal phi_H cy.

The third reference voltage −Vref may have a voltage level equal to two times that of the second reference voltage −Vref/2, and the fourth reference voltage Vref may have a voltage level equal to two times that of the first reference voltage Vref/2. In addition, the fifth reference voltage −2Vref may have a voltage level equal to two times that of the third reference voltage −Vref, and the sixth reference voltage 2Vref may have a voltage level equal to two times that of the fourth reference voltage Vref.

Respective functions of the blocks shown in FIG. 12 are similar to those explained with regard to FIG. 3. A difference thereof from the explanation in FIG. 3 in the functions of the blocks shown in FIG. 12 will be provided below.

The cyclic ADC controller 120' may generate a second digital signal Dcy when the second comparator output signal cp2_out indicates that the operational amplifier output voltage op_out has a voltage level lower than that of the second reference voltage −Vref/2, the cyclic ADC controller 120' may generate a second digital signal Dcy having a value of "−1". When the second comparator output signal cp2_out indicates that the operational amplifier output voltage op_out has a voltage level equal to or higher than the second reference voltage −Vref/2, and when the first comparator output signal cp1_out indicates that the operational amplifier output voltage has a voltage level lower than that of the first reference voltage Vref/2, the cyclic ADC controller 120' may generate a second digital signal Dcy having a value of "0". In addition, the cyclic ADC controller 120' may generate a second digital signal Dcy having a value of "1" when the first comparator output signal cp1_out indicates that the operational amplifier output voltage op_out has a voltage level equal to or higher than the first reference voltage Vref/2.

The control signal generator 130' may only activate the fourth DAC control signal phi_L_cy when the second digital signal Dcy has a value of "−1", may only activate the second DAC control signal phi_M when the second digital signal Dcy has a value of "0", and may only activate and output the fifth DAC control signal phi_H cy when the second digital signal Dcy has a value of "1".

The DAC 106' may output the third reference voltage −Vref, the ground voltage, the fourth reference voltage Vref, the fifth reference voltage −2Vref or the sixth reference voltage 2Vref to a DAC output node in response to the first to fifth DAC control signals phi_L, phi_M, phi_H, phi_L_cy, and phi_H cy.

Figure 13:
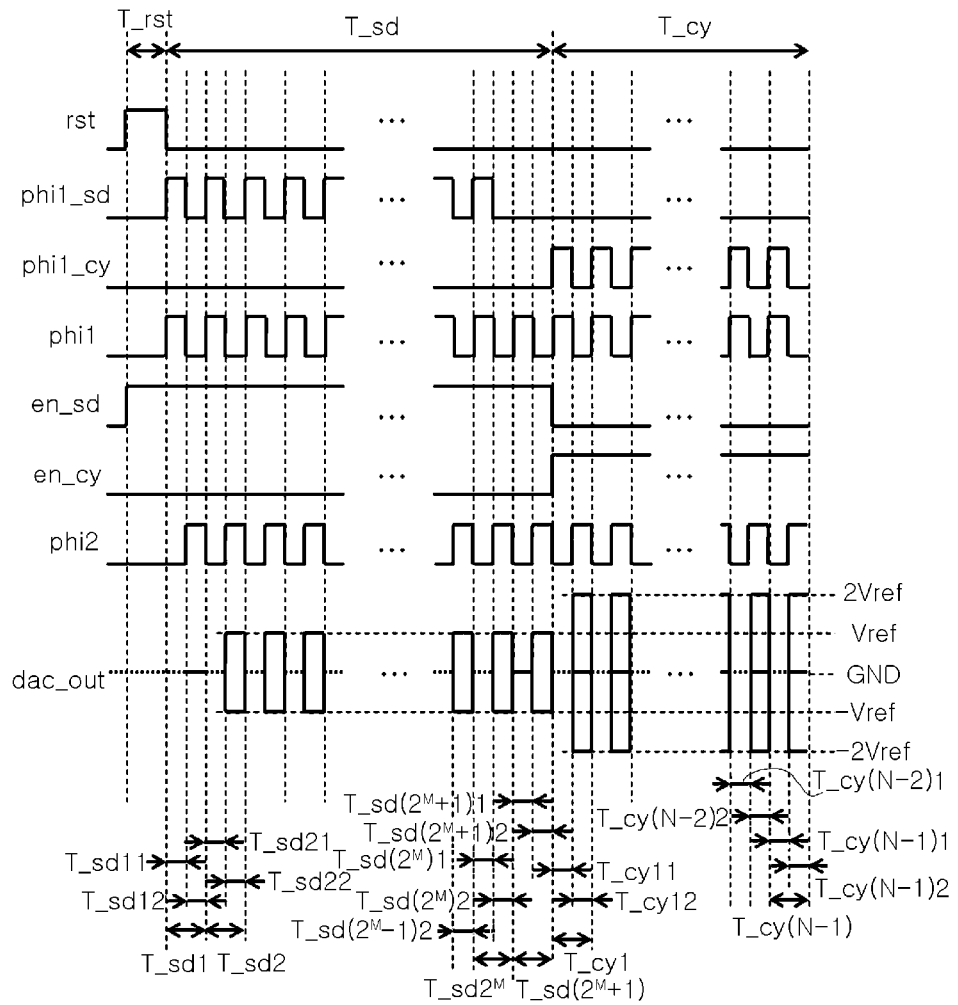
FIG. 13 is a timing diagram for explaining an operation of a conversion circuit of the ADC shown in FIG. 12 according to the second embodiment of the inventive concept.

FIG. 13 is a timing diagram for explaining an operation of the conversion circuit 100' of the ADC shown in FIG. 12 according to the second embodiment of the inventive concept. In FIG. 13, rst refers to a reset signal, phi1_sd, phi1, phi1_cy and phi2 respectively refer to first to fourth control signals, en_sd refers to a sigma-delta enable signal, en_cy refers to a cyclic enable signal, phi_L, phi_M and phi_H respectively refer to first to third DAC control signals, and dac_out refers to a DAC output voltage. In FIG. 13, in waveform diagrams representing DAC output voltages, sections shown by a dotted line indicate that an output terminal of the DAC 106' is floated.

Figure 14:
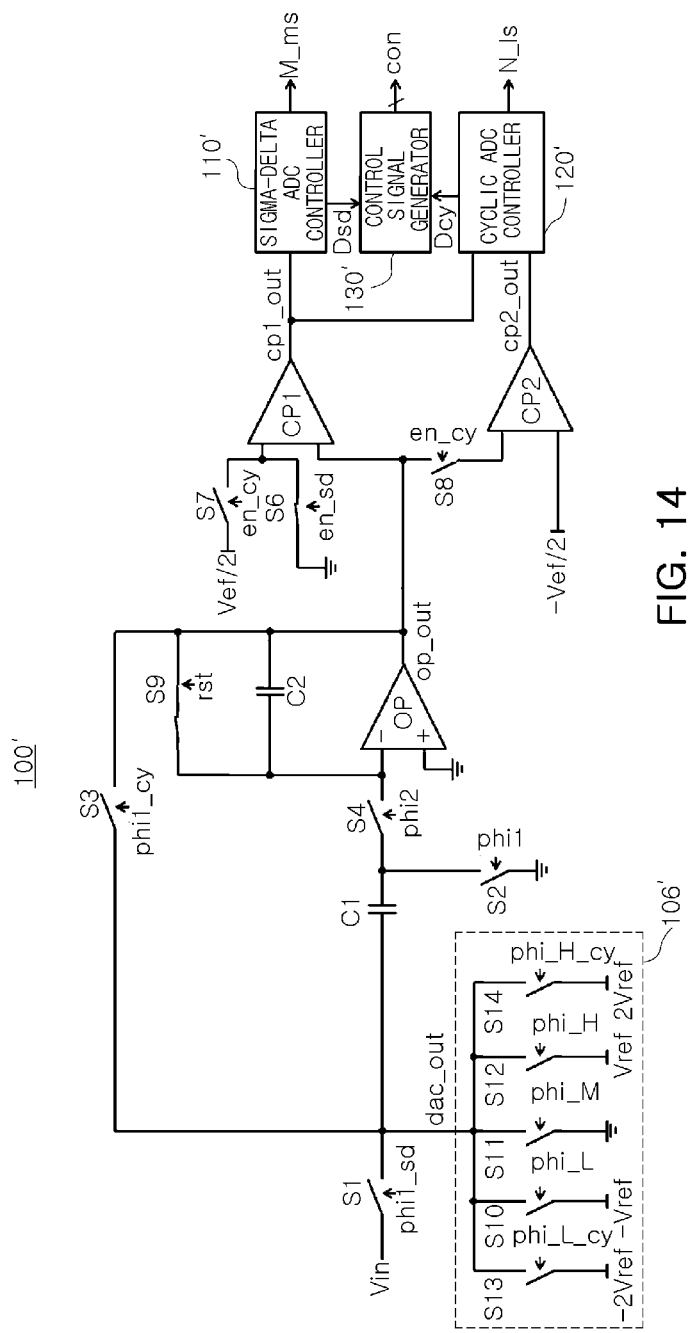
FIG. 14 explains an operation of the conversion circuit of the ADC, according to the second embodiment of the inventive concept, in a reset period of the timing diagram shown in FIG. 13.

FIG. 14 explains an operation of the conversion circuit 100' of the ADC 30-*k*, according to the second embodiment of the inventive concept, in a reset period T_rst of the timing diagrams shown in FIG. 13.

An operation in the reset period T_rst can be easily understood with reference to FIG. 5. That is, a feedback capacitor C2 may be discharged in the reset period T_rst. Further, an operation in which a feedback capacitor C2 is discharged may be performed in a first sampling section T_sd11 of the sigma-delta ADC operating period T_sd.

Figure 15:
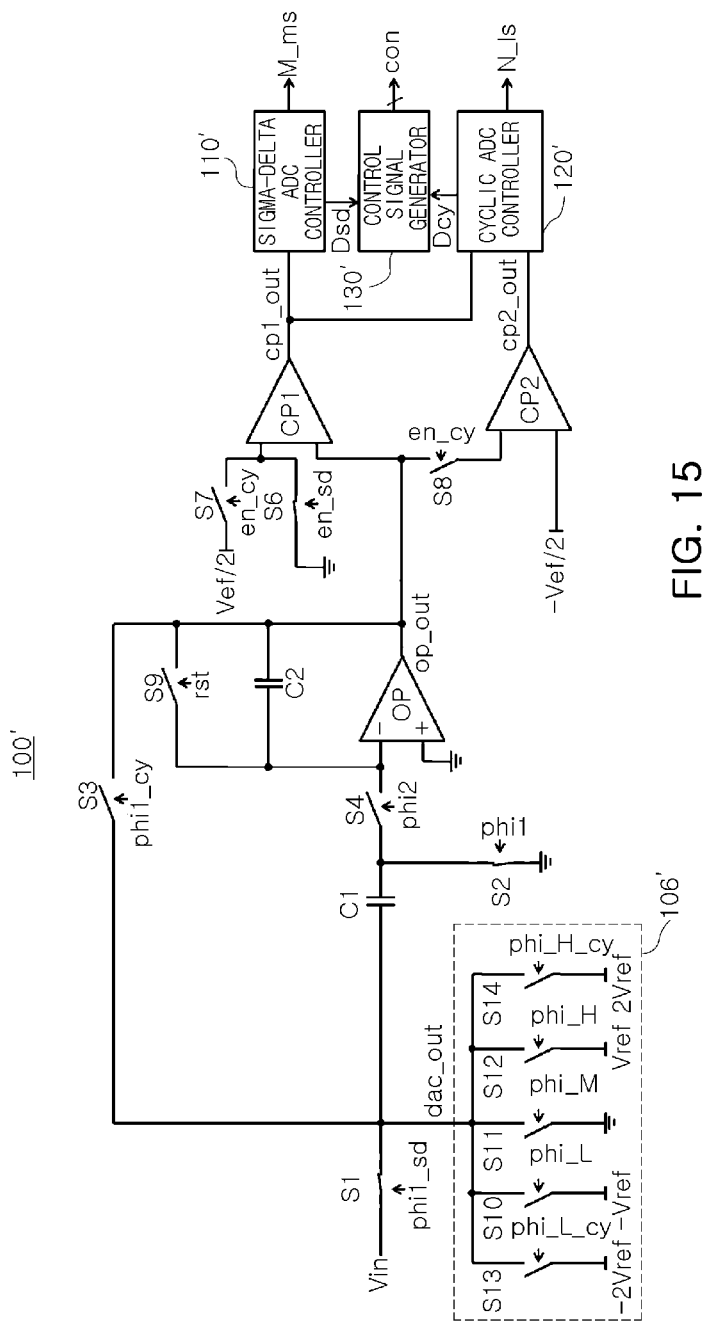
FIG. 15 explains an operation of the Conversion circuit of the ADC shown in FIG. 12, according to the second embodiment of the inventive concept, in a sampling section of a sigma-delta ADC operating period of the operation timing diagram shown in FIG. 13.

FIG. 15 explains an operation of the Conversion circuit 100' shown in FIG. 12, according to the second embodiment of the inventive concept, in sampling sections (T_sd11, T_sd21, ..., T_sd($2^M$)1) of the sigma-delta ADC operating period T_sd of the operation timing diagram shown in FIG. 13.

An operation in the sampling sections T_sd11, T_sd21, ..., and T_sd($2^M$)1 can be easily understood with reference to FIG. 6. In the sampling sections T_sd11, T_sd21, ..., and T_sd($2^M$)1, an input voltage Vin may be stored in the sampling capacitor C1.

Figure 16:
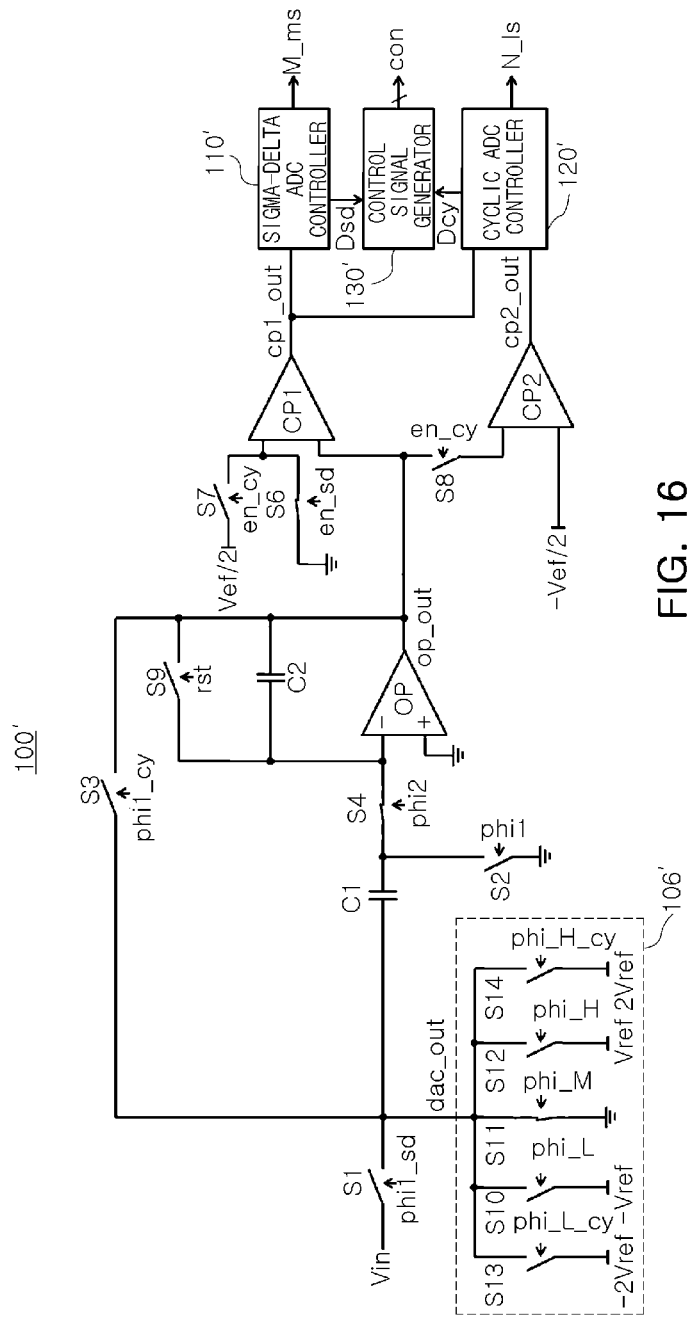
FIG. 16 explains an operation of the Conversion circuit of the ADC shown in FIG. 12, according to the second embodiment of the inventive concept, in a first integration section of a sigma-delta ADC operating period of the operation timing diagram shown in FIG. 13.

FIG. 16 explains an operation of the Conversion circuit 100' of the ADC 30-$k$ shown in FIGS. 2 and 12, according to the second embodiment of the inventive concept, in a first integration section T_sd12 of the sigma-delta ADC operating period T_sd of the operation timing diagram shown in FIG. 13.

An operation in the first integration section T_sd12 can be easily understood with reference to the explanation of FIG. 7. However, in the first integration section T_sd12, charges corresponding to the input voltage Vin rather than to a charge corresponding to ½ of the input voltage Vin may be accumulated in the feedback capacitor C2.

Figure 17:
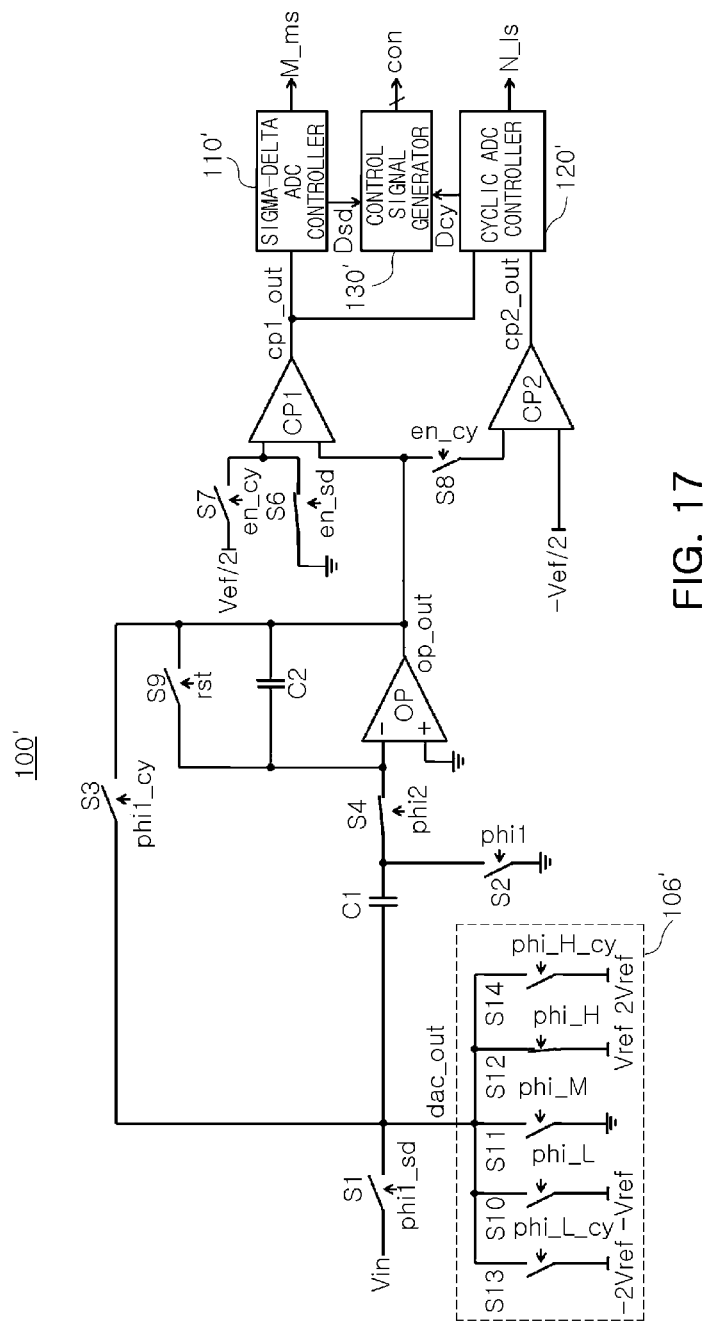
FIG. 17 explains an operation of the Conversion circuit of the ADC shown in FIG. 12, according to the second embodiment of the inventive concept, in second and subsequent integration sections of a sigma-delta ADC operating period of the operation timing diagram shown in FIG. 13.

FIG. 17 explains an operation of the Conversion circuit 100' of the ADC 30-$k$ shown in FIGS. 2 and 12, according to the second embodiment of the inventive concept, in second and subsequent integration sections (T_sd22, ..., and T_sd($2^M$+1)2) of the sigma-delta ADC operating period T_sd of the operation timing diagram shown in FIG. 13.

An operation in the integration sections T_sd22, ..., and T_sd($2^M$+1)2 can be easily understood with reference to the explanation of FIG. 8. However, in the integration sections T_sd22, ..., and T_sd($2^M$+1)2, charges corresponding to a difference between reference voltages selected from the input voltage Vin and the third and fourth reference voltages –Vref and Vref may be accumulated in the feedback capacitor C2.

Therefore, an operational amplifier output voltage op_out in the integration sections T_sd12, T_sd22, ..., and T_sd ($2^M$)2 may be represented by the following equation.

$$Vout2 = Vout1 + (Vin - Dsd*Vref) \quad \text{(Equation)}$$

In the equation above, Vout2 refers to an output voltage of the operational amplifier OP in a current integration section, Vout1 refers to an output voltage of the operational amplifier OP in a previous integration section, Vin refers to a voltage of an input voltage, and Dsd refers to a first digital signal determined in a previous integration section.

Figure 18:
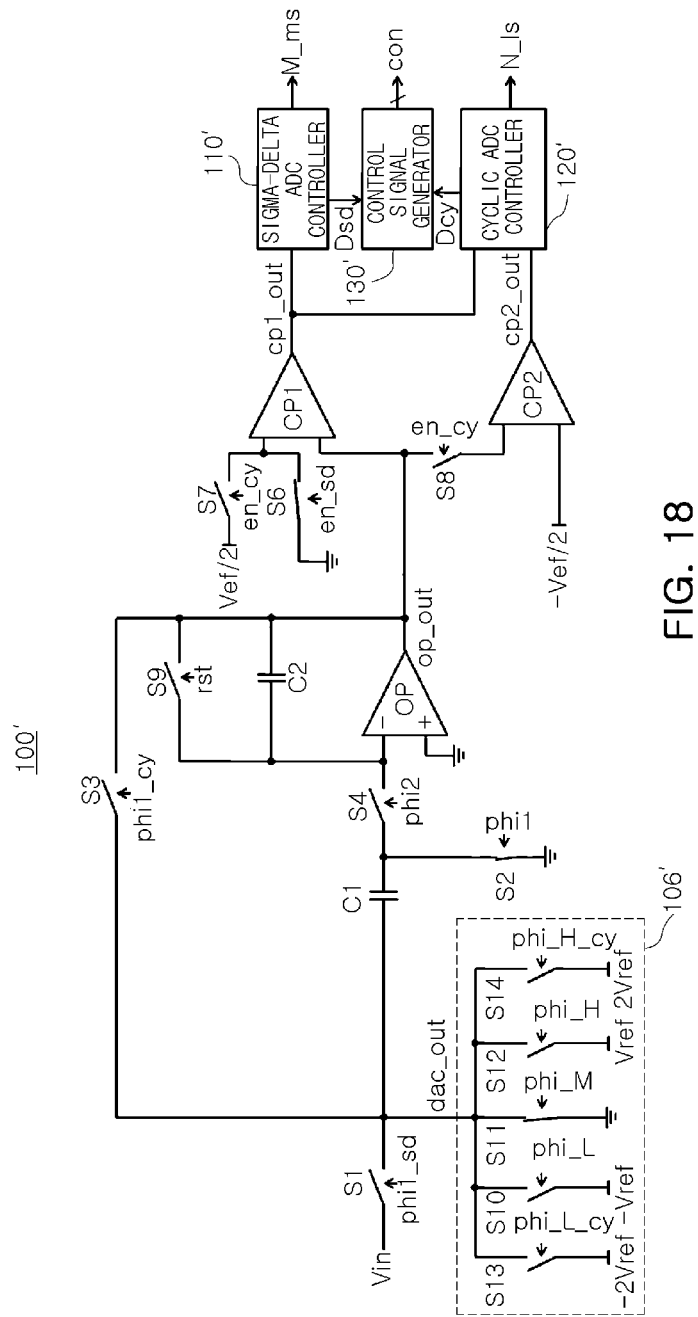
FIG. 18 explains an operation of the Conversion circuit of the ADC shown in FIG. 12, according to the second embodiment of the inventive concept, in a ground voltage sampling section of a sigma-delta ADC operating period of the operation timing diagram shown in FIG. 13.

FIG. 18 explains an operation of the Conversion circuit 100' of the ADC 30-$k$ shown in FIGS. 2 and 12, according to the second embodiment of the inventive concept, in a ground voltage sampling section T_sd($2^M$+1)1 of the sigma-delta ADC operating period T_sd of the operation timing diagram shown in FIG. 13.

An operation in the ground voltage sampling section T_sd ($2^M$+1)1 can be easily understood with reference to the explanation of FIG. 9.

During the sigma-delta ADC operating period T_sd, the conversion circuit 100' according to the second embodiment of the inventive concept may perform the operation explained with respect to FIGS. 15 and 16 once, and then, may perform the $2^M$−1 number of the operations explained with respect to FIGS. 15 and 17 repeatedly, and further, may perform the operation explained for FIGS. 18 and 17 once. Resultantly, when the operation in the sigma-delta ADC operating period T_sd is completed, charges corresponding to a voltage determined by the following equation may be accumulated in the feedback capacitor C2.

$$2^M*Vin - (Dsd1*Vref + Dsd2*Vref + \ldots + Dsd(2^M)*Vref) \quad \text{(Equation)}$$

In the above-mentioned equation, each of Dsc1, Dsd2, ..., and Dsd($2^M$) refers to a first digital signal determined in the integration sections T_sd12, T_sd22, ..., and T_sd($2^M$)2.

Resultantly, charges corresponding to a voltage obtained by deducting a voltage corresponding to high order M-bits of data M_ms acquired by the sigma-delta ADC controller 110', from an input voltage Vin, may be accumulated in the feedback capacitor C2.

Figure 19:
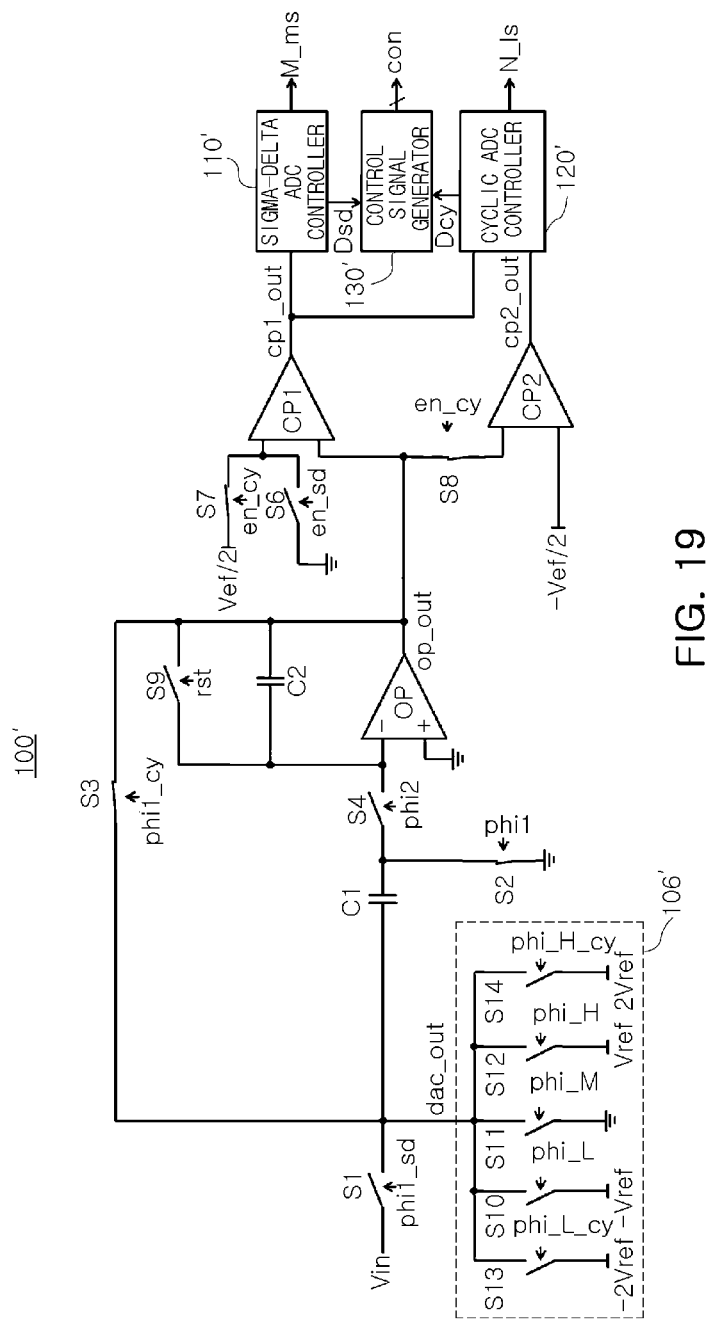
FIG. 19 explains an operation of the Conversion circuit of the ADC shown in FIG. 12, according to the second embodiment of the inventive concept, in a sampling section of a cyclic ADC operating period of the operation timing diagram shown in FIG. 13.

FIG. 19 explains an operation of the Conversion circuit 100' of the ADC 30-$k$ shown in FIGS. 2 and 12, according to the second embodiment of the inventive concept, in sampling sections (T_cy11, ..., and T_cy(N−1)1) of a cyclic ADC operating period T_cy of the operation timing diagram shown in FIG. 13.

An operation in the sampling sections T_cy11, ..., and T_cy(N−1)1 can be easily understood with reference to the explanation of FIG. 10. In the sampling sections T_cy11, ..., and T_cy(N−1)1, charges corresponding to the operational amplifier output voltage op_out may be stored in the sampling capacitor C1. Here, an amount of charge stored in the feedback capacitor C2 may not be changed.

Figure 20:
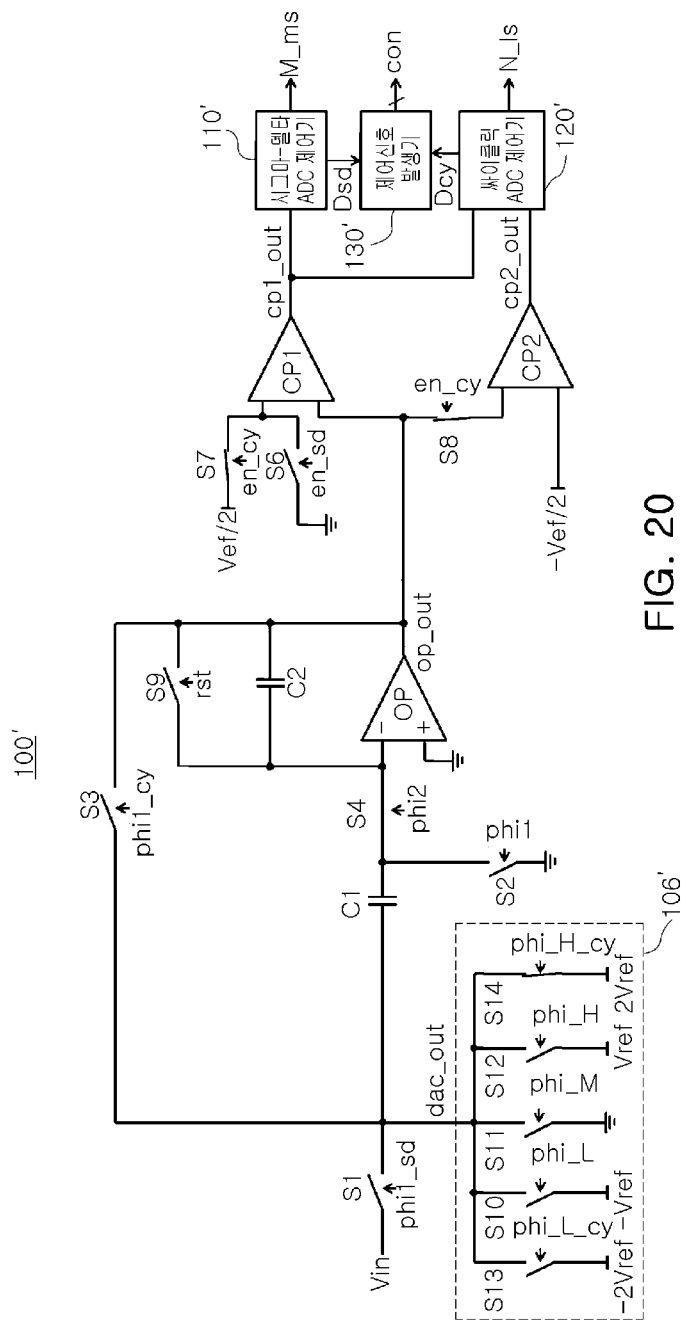
FIG. 20 explains an operation of the Conversion circuit of the ADC shown in FIG. 12, according to the second embodiment of the inventive concept, in an amplification section of a cyclic ADC operating period of the operation timing diagram shown in FIG. 13.

FIG. 20 explains an operation of the Conversion circuit 100' of the ADC 30-$k$ shown in FIGS. 2 and 12, according to the second embodiment of the inventive concept, in amplification sections (T_cy12, ..., and T_cy(N−1)2) of a cyclic ADC operating period T_cy of the operation timing diagram shown in FIG. 13.

An operation in the amplification sections T_cy12, ..., and T_cy(N−1)2 can be easily understood with reference to the explanation of FIG. 11. In the amplification sections T_cy12, ..., and T_cy(N−1)2, charges corresponding to a difference between the operational amplifier output voltage op_out and a selected reference voltage, that is, the fifth reference voltage –2Vref, the ground voltage, or the sixth reference voltage 2Vref, may be accumulated in the feedback capacitor C2.

In the amplification sections, the operational amplification output voltage op_out may be determined by the following equation.

$$Vout2 = 2*Vout1 - Dcy*2Vref \quad \text{(Equation)}$$

In the above-mentioned equation, Vout2 refers to an operational amplifier output voltage op_out in a current amplification section, Vout1 refers to an operational amplifier output voltage op_out in an immediately previous amplification section, and Dcy refers to a second digital signal determined in a previous amplification section.

The conversion circuit 100' according to the second embodiment of the inventive concept may repeatedly perform the N−1 times of the operations explained with respect to FIGS. 19 and 20. Further, the cyclic ADC controller 120' may generate and output low order N-bits of data N_ls by using the N−1 number of second digital signals Dcy generated from the first to N−1 numbered amplification operations.

Though not shown in the drawings, in the conversion circuit 100 according to the first embodiment of the inventive concept and the conversion circuit 100' according to the second embodiment of the inventive concept, an operation in which the sampling capacitor C1 is discharged may be added before the sampling operation. For example, immediately before the sections T_sd11, ..., T_sd($2^M$+1)1, T_cy11, ..., and T_cy(N−1), the sampling capacitor C1 may be discharged by activating the second DAC control signal phi_M and the second control signal phi1 such that switches S11 and S2 are turned on. This operation may only be performed in the cyclic ADC operating period or may be also performed in both of the sigma-delta ADC operating period and the cyclic ADC operating period. Through this operation, noise effect may be significantly reduced.

Figure 21:
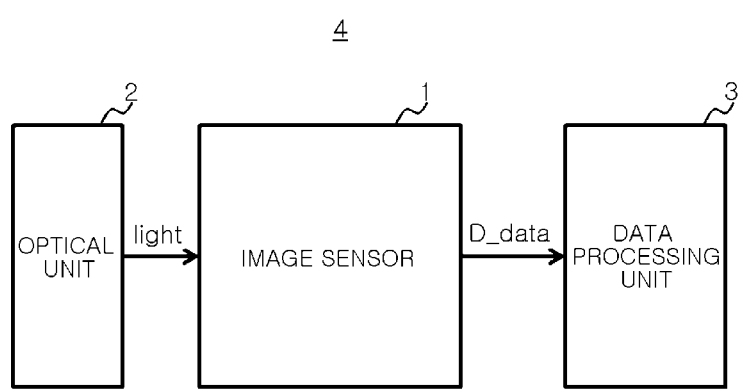
FIG. 21 is a block diagram of an apparatus according to an embodiment of the inventive concept, including the image sensor according to the embodiment of the inventive concept.

FIG. 21 is a block diagram of an apparatus 4 according to an embodiment of the inventive concept, including the image sensor according to the embodiment of the inventive concept. The apparatus 4 including the image sensor according to the embodiment of the inventive concept may include an image sensor 1, an optical unit 2 and a data processing unit 3.

Respective functions of the blocks shown in FIG. 21 will be described below.

The optical unit 2 may include a lens (not shown) and various devices (not shown) fixing the lens (not shown), and may collect light.

The image sensor 1 may have the same configuration as those shown in FIGS. 1 to 20 and may output a digital image signal D_data corresponding to light collected by the optical unit 2.

The data processing unit 3 may process or store the digital image data D_data. For example, the data processing unit 3 may perform an operation such as edge enhancement and/or noise reduction, or the like, by receiving the digital image data D_data, and may store the digital image data or processed image data by providing a memory device (not shown) or the like therewith.

The apparatus shown in FIG. 21 may be included in a digital camera, a mobile phone, or the like.

As set forth above, in an ADC according to an embodiment of the inventive concept, one circuit initially operating with a sigma-delta ADC and subsequently operating with a cyclic ADC may be included, whereby a relatively high resolution of output results may be obtained simultaneously with reducing an area needed to implement the ADC and decreasing power consumption. In addition, an operation speed and operation precision may be increased.

While the inventive concept has been shown and described in connection with the embodiments, it will be apparent to those skilled in the art that modifications and variations can be made without departing from the spirit and scope of the invention as defined by the appended claims.

What is claimed is:

1. An analog-to-digital converter comprising:
a signal processing unit generating an operational amplifier output voltage in response to an input voltage and a digital analog converter (DAC) output voltage in a sigma-delta operating period and generating the operational amplifier output voltage in response to a feed-backed operational amplifier output voltage and the DAC output voltage in a cyclic operating period;
a control unit generating a DAC control signal by comparing the operational amplifier output voltage with a first reference voltage in the sigma-delta operating period and obtaining high order M-bits of data, and generating the DAC control signal by comparing the operational amplifier output voltage with second and third reference voltages in the cyclic operating period and obtaining low order N-bits of data; and
a digital analog converter generating the DAC output voltage in response to the DAC control signal.

2. The analog-to-digital converter of claim 1, wherein the first reference voltage is a ground voltage, the second reference voltage has a positive reference value and the third reference voltage has a negative reference value.

3. The analog-to-digital converter of claim 2, wherein the digital analog converter outputs, as the DAC output voltage, a voltage having a value equal to four times that of the positive reference value or a value equal to four times that of the negative reference value at the time of a sigma-delta operation, and outputs, as the DAC output voltage, a voltage having a value equal to four times that of the positive reference value, the ground voltage, or a voltage having a value equal to four times that of the negative reference value at the time of a cyclic operation.

4. The analog-to-digital converter of claim 2, wherein the digital analog converter outputs, as the DAC output voltage, a voltage having a value equal to two times that of the positive reference value or a value equal to two times that of the negative reference value at the time of the sigma-delta operation, and outputs, as the DAC output voltage, a voltage having a value equal to four times that of the positive reference value, the ground voltage or a voltage having a value equal to four times that of the negative reference value at the time of the cyclic operation.

5. The analog-to-digital converter of claim 1, wherein the signal processing unit includes:
an operational amplifier having a first input terminal connected to a ground voltage and outputting the operational amplifier output voltage;
a first switch connected between a terminal to which the input voltage is applied and a DAC output terminal to which the DAC output voltage is applied;
a sampling capacitor having one side thereof connected to the DAC output terminal;
a second switch connected between the other side of the sampling capacitor and the ground voltage;
a third switch connected between the DAC output terminal and an output terminal of the operational amplifier;
a fourth switch connected between the other side of the sampling capacitor and a second input terminal of the operational amplifier;
a first feedback capacitor connected between the second input terminal of the operational amplifier and the output terminal of the operational amplifier;
a fifth switch having one side thereof connected to the second input terminal of the operational amplifier; and
a second feedback capacitor connected between the other side of the fifth switch and the output terminal of the operational amplifier.

6. The analog-to-digital converter of claim 5, wherein the second switch is periodically turned on and off, the fifth switch is turned on in the sigma-delta operating period and turned off in the cyclic operating period, the fourth switch is periodically turned on and off in opposition to the second switch, the first switch is turned on and off with the second switch in the sigma-delta operating period and turned off in the cyclic operating period, and the third switch is turned on and off with the second switch in the cyclic operating period and turned off in the sigma-delta operating period.

7. The analog-to-digital converter of claim 5, wherein the signal processing unit further includes a reset switch connected between the second input terminal of the operational amplifier and the output terminal of the operational amplifier and is turned on before the sigma-delta operation.

8. The analog-to-digital converter of claim 1, wherein the control unit includes:

a first comparator including a first input terminal connected to a terminal to which the operational amplifier output voltage is applied;

a first switch connected between a terminal to which the first reference voltage is applied and a second input terminal of the first comparator;

a second switch connected between a terminal to which the second reference voltage is applied and the second input terminal of the first comparator;

a third switch having one side thereof connected to the terminal to which the operational amplifier output voltage is applied; and an analog-to-digital converter including a second comparator having a first input terminal connected to the other side of the third switch and a second input terminal to which the third reference voltage is applied.

9. The analog-to-digital converter of claim 8, wherein the first switch is turned on in the sigma-delta operating period and turned off in the cyclic operating period, and the second switch and the third switch are turned off in the sigma-delta operating period and turned on in the cyclic operating period.

10. The analog-to-digital converter of claim 9, wherein the control unit includes:

a sigma-delta controller outputting a first digital value and the high order M-bits of data in response to an output signal of the first comparator;

a cyclic controller outputting a second digital value and the low order N-bits of data in response to the output signal of the first comparator and an output signal of the second comparator; and a control signal generator receiving the first value and the second digital value to thus output the DAC control signal.

11. The analog-to-digital converter of claim 1, wherein the signal processing unit includes:

an operational amplifier having a first input terminal connected to a ground voltage and outputting the operational amplifier output voltage;

a first switch connected between a terminal to which the input voltage is applied and a DAC output terminal to which the DAC output voltage is applied;

a sampling capacitor having one side thereof connected to the DAC output terminal;

a second switch connected between the other side of the sampling capacitor and the ground voltage;

a third switch connected between the DAC output terminal and an output terminal of the operational amplifier;

a fourth switch connected between the other side of the sampling capacitor and a second input terminal of the operational amplifier; and a feedback capacitor connected between the second input terminal of the operational amplifier and the output terminal of the operational amplifier.

12. The analog-to-digital converter of claim 11, wherein the second switch is periodically turned on and off, the fourth switch is periodically turned on and off in opposition to the second switch, the first switch is turned on and off with the second switch in the sigma-delta operating period and turned off in the cyclic operating period, and the third switch is turned on and off with the second switch in the cyclic operating period and turned off in the sigma-delta operating period.

13. The analog-to-digital converter of claim 11, wherein the signal processing unit further includes a reset switch connected between the second input terminal of the operational amplifier and the output terminal of the operational amplifier and is turned on before the sigma-delta operation.

14. The analog-to-digital converter of claim 1, wherein the analog-to-digital converter further includes an error correction circuit receiving the high order M-bits of data and the low order N-bits of data and outputting resultant data of M+N bits by correcting an error thereof.

15. An image sensor comprising:

a pixel unit including at least one pixel outputting an analog signal according to light input from an outside; and an analog digital conversion unit including at least one analog-to-digital converter converting the analog signal into a digital signal, the at least one analog-to-digital converter including, a signal processing unit generating an operational amplifier output voltage in response to the analog signal and a DAC output voltage in a sigma-delta operating period and generating the operational amplifier output voltage in response to a feedbacked operational amplifier output voltage and the DAC output voltage in a cyclic operating period;

a control unit generating a DAC control signal by comparing the operational amplifier output voltage with a first reference voltage in the sigma-delta operating period and obtaining high order M-bits of data and generating the DAC control signal by comparing the operational amplifier output voltage with second and third reference voltages in the cyclic operating period and obtaining low order N-bits of data; and a digital analog converter generating the DAC output voltage in response to the DAC control signal.

16. The image sensor of claim 15, wherein the pixel unit includes a plurality of the pixels disposed in matrix form.

17. The image sensor of claim 16, further comprising a row driver outputting a driving signal driving pixels disposed on a selected row among the plurality of pixels.

18. The image sensor of claim 16, wherein the analog digital conversion unit includes the analog-to-digital converter on every row on which the plurality of pixels are disposed.

19. An apparatus comprising:

the image sensor of claim 15;

an optical unit collecting light input from the outside and transferring the collected light to the pixel unit; and a data processing unit receiving the digital signal to process or store the received digital signal.

20. The apparatus of claim 19, wherein the apparatus is a digital camera.

21. An analog-to-digital converter comprising:

an internal circuit receiving an input signal and generating an output signal;

a sigma-delta controller controlling to operate the internal circuit as a sigma-delta analog-to-digital converter when the input signal is input from an outside and obtaining high order M-bits of a digital signal among digital signals corresponding to the input signal by inputting the output signal thereto; and a cyclic controller controlling to operate the internal circuit as a cyclic analog-to-digital converter after obtaining the high order M-bits of the digital signal and obtaining low order N-bits of a digital signal among the digital signals by inputting the output signal thereto, wherein the internal circuit includes:

a signal processing unit generating the output signal in response to the input signal and a reference voltage when the internal circuit operates to serve as the sigma-delta analog-to-digital converter and generating the output signal in response to the output signal of the internal circuit, which has been feedbacked, and the reference voltage; and a reference voltage generating unit controlled by the sigma-delta controller and the cyclic controller and generating the reference voltage having a different value according to a magnitude of the output signal.

* * * * *